United States Patent [19]
Andoh

[11] Patent Number: 6,075,279
[45] Date of Patent: Jun. 13, 2000

[54] SEMICONDUCTOR DEVICE

[75] Inventor: Mamoru Andoh, Isesaki, Japan

[73] Assignee: Sanyo Electric Co., Ltd., Osaka, Japan

[21] Appl. No.: 08/881,356

[22] Filed: Jun. 24, 1997

[30] Foreign Application Priority Data

| | | | | |
|---|---|---|---|---|
| Jun. 26, 1996 | [JP] | Japan | ................................ | 8-166006 |
| Jun. 28, 1996 | [JP] | Japan | ................................ | 8-170282 |
| Jun. 28, 1996 | [JP] | Japan | ................................ | 8-170283 |

[51] Int. Cl.$^7$ .................................................. H01L 23/544
[52] U.S. Cl. .......................... 257/620; 257/686; 257/723; 257/777; 257/778
[58] Field of Search .................................. 257/620, 723, 257/666, 686, 676, 778, 737, 738, 777

[56] References Cited

U.S. PATENT DOCUMENTS

| | | | |
|---|---|---|---|
| 5,321,303 | 6/1994 | Kawahara et al. | ........................ 257/620 |
| 5,723,907 | 3/1998 | Akram | ........................ 257/723 |
| 5,844,304 | 12/1998 | Kata et al. | ........................ 257/620 |

FOREIGN PATENT DOCUMENTS

| | | |
|---|---|---|
| 3248551 | 11/1991 | Japan . |
| 5129473 | 5/1993 | Japan . |
| 6338504 | 12/1994 | Japan . |

*Primary Examiner*—Carl Whitehead, Jr.
*Assistant Examiner*—Roy Potter
*Attorney, Agent, or Firm*—Loeb & Loeb, LLP

[57] ABSTRACT

In a semiconductor device of the present invention, since a second semiconductor substrate is provided wherein a part of a semiconductor device in which an active device is formed is utilized as electrodes and third electrodes are formed on a surface of the second semiconductor substrate and fourth electrodes are formed on a back surface of the second semiconductor substrate to be connected to external devices, the semiconductor device can be provided wherein metal lead terminals connected to external electrodes and protection sealing mold can be omitted by employing the second semiconductor substrate as external connecting electrodes, unlike the semiconductor device in the prior art.

Accordingly, outer sizes of the semiconductor device can be remarkably miniaturized, and unnecessary dead space can be eliminated when the device is packaged on a packaging substrate, whereby contributing significantly to miniaturization of the packaging substrate.

17 Claims, 17 Drawing Sheets ns the packaging substrate 30 from being formed with high density and miniaturized.

In particular, this problem remarkably occurs in the semiconductor device having a small package size. For instance, as shown in FIG. 3, a size of the semiconductor chip (SC-75A) based on the EIAJ standard is 0.40 mm×0.40 mm at its maximum. When the semiconductor chip is plastic-molded as shown in FIG. 1, an overall size of the semiconductor device is 1.6 mm×1.6 mm. Hence, the chip area of the semiconductor device is 0.16 mm$^2$ and the packaging area on which the semiconductor device is packaged is 2.56 mm$^2$ if the packaging area is assumed to be substantially identical to the area of the semiconductor device. Therefore, a rate of an effective packaging area of the semiconductor device becomes about 6.25%. This means that most of the packaging area is occupied by the dead space having no direct connection with the semiconductor chip area which is used to execute the preselected function.

With respect to the packaging substrate for use in various recent electronic devices, e.g., portable information processing unit such as personal computer, electronic pocketbook, etc., 8 mm video camera, portable telephone, camera, liquid crystal television, and the like, packaging substrates employed in such electronic devices tend to be formed with high density and miniaturized with the progress of miniaturization of the main body of electronic devices.

However, in the above semiconductor device, reduction in size or miniaturization of the packaging substrate is prevented by such large dead space.

As a prior art showing an improvement in a rate of an effective packaging area, there has been a Patent Application Publication (KOKAI) 3-248551 (see FIG. 4). In this prior art reference, in order to reduce the packaging area as much as possible, such a technique has been set forth that lead terminals 41, 42, 43 which are connected respectively to base, emitter, and collector electrodes of a semiconductor chip 40 are formed not to protrude outwardly from side surfaces of the plastic mold 44 and to constitute identical surfaces to the side surfaces of the plastic mold 44.

According to this configuration, the packaging area can be made small because top end portions of the lead terminals 41, 42, 43 do not project outwardly, but a size of the dead space cannot be so improved as it would be expected.

In the above semiconductor device, there have been such problems that a wire connecting step and an injection molding step for the molding plastic are needed to thus make a material cost higher and to make manufacturing steps complicated, and as a result a production cost cannot be reduced.

In order to increase a rate of an effective packaging area at its maximum, if the semiconductor chip is packaged directly on the packaging substrate, as described above, a rate of an effective packaging area can be maximized.

Meanwhile, as a prior art showing packaging of the semiconductor chip on the substrate such as the packaging substrate, a flip-chip technique has been well known wherein a flip-chip in which a plurality of bump electrodes 46 are formed on a semiconductor chip 45 is bonded to a packaging substrate 47 in terms of face down bonding, for example, as shown in a Patent Application Publication (KOKAI) 6-338504 (see FIG. 5). Usually, this prior art has been mainly applied to a lateral semiconductor device such as MOSFET, etc. with relatively small heat generation, wherein a gate (base) electrode, a source (emitter) electrode, and a drain (collector) electrode are formed on the same principal surface of the silicon substrate and current or voltage paths are formed in the lateral direction.

SEMICONDUCTOR DEVICE

BACKGROUND OF THE INVENTION

1. Field of the Invention

The present invention relates to a semiconductor device and, more particularly, an improvement in the semiconductor device capable of increasing a rate of an effective packaging area which is represented by a ratio of a semiconductor device chip area to a packaging area of a packaging substrate such as a printed-circuit board, in which the semiconductor device is packaged.

2. Description of the Prior Art

In general, a configuration shown in FIG. 1 has been used as a semiconductor device in which a transistor device is formed on a silicon substrate. A reference 1 denotes a silicon substrate; 2, an island such as a heat radiation board on which the silicon substrate 1 is mounted; 3, a lead terminal; and 4, a sealing plastic.

As shown in FIG. 1, the silicon substrate 1 on which the transistor device is formed is secured with a brazing filler metal 5 such as solder to the island 2 such as a copper-based heat radiation board to be mounted thereon. A base electrode and an emitter electrode of the transistor device are electrically connected via bonding wires to respective lead terminals 3 which are arranged in the neighboring area of the silicon substrate 1. The lead terminal 3 to be connected to a collector electrode is formed integrally with the island 2. The silicon substrate 1 is electrically connected to the island 2 by mounting the silicon substrate 1 on the island 2, and then the silicon substrate 1 and a part of the lead terminal 3 are molded by a thermoset plastic 4 such as epoxy resin in terms of transfer molding.

Usually such plastic-molded semiconductor device is packaged on the packaging substrate such as a glass epoxy substrate and is then electrically connected to other semiconductor devices or circuit elements which are mounted on the same packaging substrate. A resultant semiconductor device is then treated as a single parts to carry out a predetermined circuit operation.

FIG. 2 shows a sectional profile of the semiconductor device in the prior art when the semiconductor device is packaged on the packaging substrate. A reference 20 denotes a semiconductor device; 21, 23, lead terminals for the base and emitter electrodes; 22, a lead terminal for the collector electrode; and 30, a packaging substrate.

A packaging area of a packaging substrate 30 in which the semiconductor device 20 is packaged can be represented by a region which is surrounded by the lead terminals 21, 22, 23 and conductive pads connected to these lead terminals 21, 22, 23. Such packaging area is large in contrast to the silicon substrate (semiconductor chip) area in the semiconductor device 20. Most of the packaging area is occupied by molding plastic and the lead terminals rather than the semiconductor chip area which effects actually a preselected function.

If a ratio of the semiconductor chip area having the actual preselected function to the packaging area is now defined as a rate of an effective packaging area, it can be understood that such rate of the effective packaging area is extremely low in the plastic-molded semiconductor device. A low rate of the effective packaging area indicates the presence of a large dead space which is not directly concerned with the packaging area of the semiconductor chip, most of the packaging area of the semiconductor chip being used to execute a preselected function. Such large dead space pre- However, in a vertical semiconductor device like a transistor device, etc. wherein a silicon substrate serves as one of electrodes and respective electrodes are formed on a different surface so that current paths are formed in the vertical direction, it is difficult to employ the above flip-chip technique.

SUMMARY OF THE INVENTION

It is an object of the present invention to provide a semiconductor device capable of increasing at its maximum a rate of an effective area which is defined by a ratio of an area of a semiconductor chip to a packaging area of a packaging substrate, in which the semiconductor device is packaged, and also decreasing a dead space of the packaging area at its minimum, by eliminating both lead terminals to be connected to the semiconductor chip and a molding plastic to cover the semiconductor chip.

According to the semiconductor device of the present invention, since there are provided a first semiconductor substrate in which diffusion layers constituting an active device are formed, a first electrode of the active device being formed on a surface of the first semiconductor substrate and a second electrode of the active device being formed on a back surface of the first semiconductor substrate to be connected to an external device, and second semiconductor substrates in which respective structures formed continuously from the first semiconductor substrate are isolated by slits, and for serving as electrodes themselves, third electrodes being formed on surfaces of the second semiconductor substrates and fourth electrodes being formed on back surfaces of the second semiconductor substrates to be connected to the external devices, the semiconductor device can be provided wherein metal lead terminals connected to external electrodes and protection sealing mold can be omitted by employing the second semiconductor substrate as external connecting electrodes, unlike the semiconductor device in the prior art.

As a result, outer sizes of the semiconductor device can be remarkably miniaturized, and unnecessary dead space can be eliminated when the device is packaged on a packaging substrate, whereby contributing significantly to miniaturization of the packaging substrate.

Further, in the semiconductor device of the present invention, as described above, since the metal lead terminals for externally connecting and the plastic sealing mold are not needed, a manufacturing cost of the semiconductor device can be made extremely low.

In addition, there is provided a method of manufacturing a semiconductor device of the present invention comprising the steps of preparing a semiconductor substrate having a first region in which diffusion layers constituting an active device are formed, a first electrode of the active device being formed on a surface of the first semiconductor substrate and a second electrode of the active device being formed on a back surface of the first semiconductor substrate to be connected to an external device, and second regions for serving as electrodes themselves, third electrodes being formed on surfaces of the second regions and fourth electrodes being formed on back surfaces of the second regions to be connected to the external devices; forming means held on an adhesive insulating material on the semiconductor substrate and for connecting electrically the first electrode to the third electrodes; and forming slits being extended from a back surface of the semiconductor substrate to a surface thereof between the first region and the second regions and slits for separating the first region and the second regions as one device.

Therefore, as described above, since the metal lead terminals for externally connecting and the plastic sealing mold can be eliminated, reduction in a manufacturing cost of the semiconductor device and simplification of the steps can be achieved.

Still further, in the method of manufacturing the semiconductor device of the present invention, the existing semiconductor device manufacturing equipment can be utilized without introducing a new manufacturing equipment.

Other and further objects and features of the present invention become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE EMBODIMENTS

Figure 1:
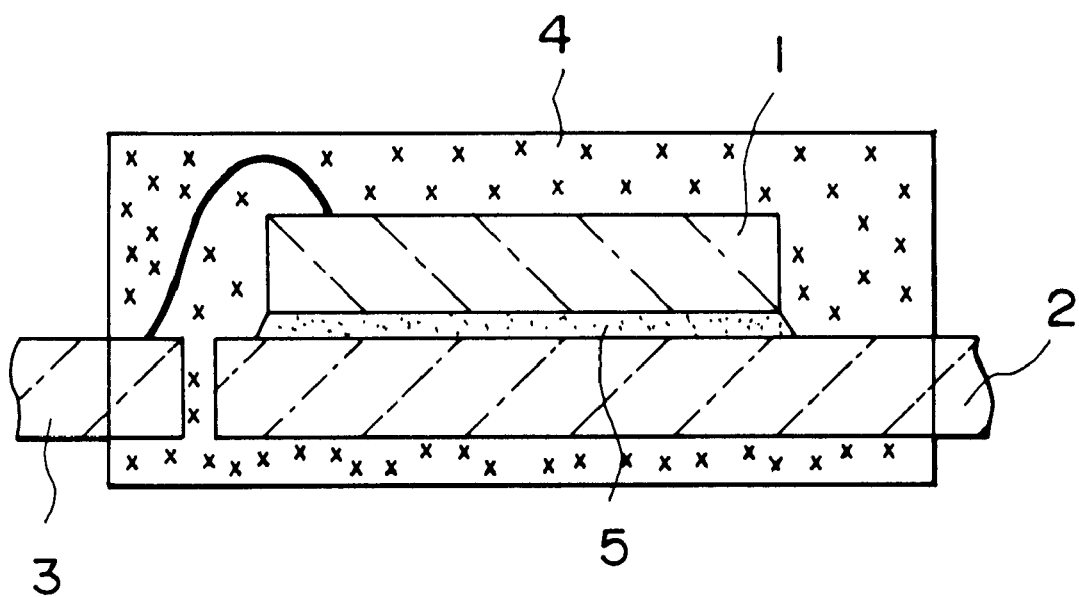
FIG. 1 is a sectional view showing a semiconductor device in the prior art.

Various embodiments of the present invention will be described with reference to the accompanying drawings. It should be noted that the same or similar reference numerals are applied to the same or similar parts or elements throughout the drawings, and the description of the same or similar parts and elements will be omitted or simplified.

The present invention is able to achieve following excellent merits throughout all embodiments from the viewpoint of both the user side and the manufacturer side.

More particularly, merits achieved on the user side are that a: a chip size is small, and b: since rear surface electrodes 62, 63, 64 of a semiconductor substrate are secured to a packaging substrate, heat generated in the semiconductor device can be dissipated to the packaging substrate.

A merit achieved on the manufacturer side is that c: an operation for forming slits and an operation for separating the semiconductor device into respective regions can be accomplished by a simple dicing apparatus.

(1) First Embodiment

A first embodiment of the present invention will be explained with reference to FIGS. 6 to 8 hereinafter.

Figure 6:
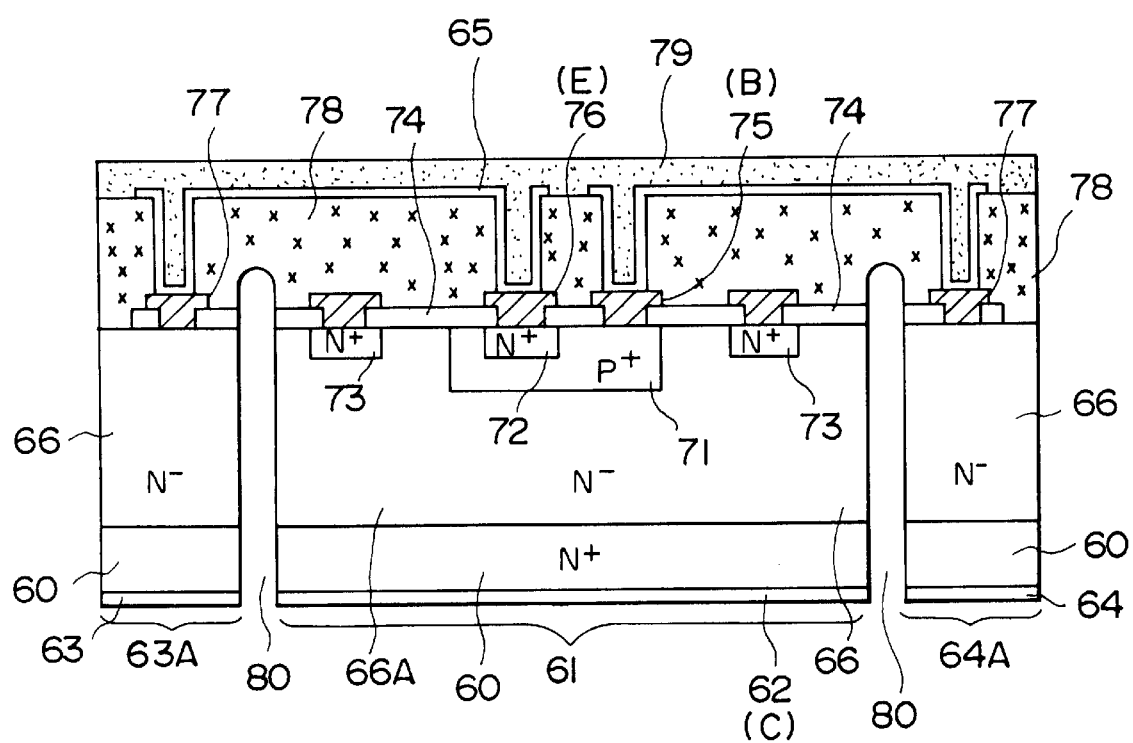
FIG. 6 is a sectional view showing a semiconductor device according to a first embodiment of the present invention.

As shown in FIG. 6, a semiconductor device according to the first embodiment comprises a semiconductor substrate 60, an active device forming region 61 in which an active device is formed, an active device formed in the active device forming region 61, a first externally connecting electrode 62 serving as a first electrode of the active device and provided to connect to external circuits, etc., second and third externally connecting electrode 63, 64 isolated electrically from the active device forming region 61 and made of respective parts of the semiconductor substrate 60 which serve as external electrodes for second and third electrodes of the active device, and a connecting means 65 for connecting the second and third electrodes of the active device to the second and third externally connecting electrode 63, 64.

An N+ single crystal silicon substrate is employed as the semiconductor substrate 60, and then an N− epitaxial layer 66 is formed on the semiconductor substrate 60 by virtue of an epitaxial growth method. The active device forming region 61 in which the active device such as power MOSFET, transistor, or the like is formed and externally connecting electrode regions 63A, 64A which serve as the second and third externally connecting electrode 63, 64 are provided in predetermined regions of the semiconductor substrate 60.

In the first embodiment, a transistor which employs the N− epitaxial layer 66 as a collector region 66A is formed. Further, a photoresist is formed on the active device forming region 61, then P type impurity such as boron (B) is selectively injected into regions being exposed from the photoresist, and then an island-like base region 71 is formed in the N− epitaxial layer 66 in terms of thermal diffusion.

Another photoresist is formed again in the active device forming region 61 of the N− epitaxial layer 66 after formation of the base region 71. An emitter region 72 of the transistor is then formed by thermally diffusing the N type impurity such as phosphorus (P), antimony (Sb), etc. selectively into the base region 71 being exposed from another photoresist. In the first embodiment, an N+ diffusion region 73 serving as a guard ring surrounding the base region 71 is formed at the same time when the emitter region 72 is formed.

An insulating film 74 made of silicon oxide film, silicon nitride film, or the like, in which a base contact hole formed to expose a surface of the base region 71 and an emitter contact hole formed to expose a surface of the emitter region 72 are provided, is formed on a surface of the N− epitaxial layer 66. In the event that the diffusion region 73 serving as the guard ring is formed, a guard ring contact hole is formed to expose a surface of the diffusion region 73. The insulating film 74 is also formed on the N− epitaxial layer 66 in the electrode regions 63A, 64A serving as the externally connecting electrode 63, 64. Externally connecting contact holes are formed to expose surfaces of the N− epitaxial layer 66 in the electrode regions 63A, 64A.

On the base region 71, the emitter region 72, the electrode regions 63A, 64A, and the guard ring diffusion region 73 which are exposed via the base contact hole, the emitter contact hole, the externally connecting contact holes, and the guard ring contact hole respectively, a base electrode 75, an emitter electrode 76, connecting electrodes 77, and a guard ring are formed by depositing a metal such as aluminum selectively.

The active device forming region 61 and the externally connecting electrode regions 63A, 64A may be formed in arbitrary regions of the N− epitaxial layer 66. However, in the first embodiment, as shown in FIG. 7, the active device forming region 61 is placed in a central region of the semiconductor substrate 60 and the externally connecting electrode regions 63A, 64A are placed on two apexes of a triangle placement which includes the region 61 as a remaining apex.

Silicon, epoxy, or polyimide insulating adhesive resin layer 78 is formed on the surface of the semiconductor substrate which includes the active device forming region 61, in which the transistor is formed, and the externally connecting electrode regions 63A, 64A. The base electrode 75 and the emitter electrode 76 of the transistor are electrically connected to the externally connecting electrode regions 64A, 63A respectively via connecting means 65 formed on the resin layer 78.

This resin layer 78 is formed in such a manner that the connecting means 65 can be isolated from the N− epitaxial layer 66 and simultaneously respective regions 61 and 63A, 64A are not fully divided from each other to be held as a single member when the active device forming region 61 is separated electrically from the externally connecting electrode regions 63A, 64A.

In the first embodiment, for example, a polyimide resin of 2 to 50 $\mu$m thickness is coated by a spinner on the surface of the semiconductor substrate, then a resultant structure is heated by burning for a predetermined time, and then a surface thereof is polished, whereby the planarized resin layer 78 can be formed.

On the base electrode 75 and the emitter electrode 76 of the transistor formed in the active device forming region 61 and the connecting electrodes 77 formed in the externally connecting electrode regions 63A, 64A, contact holes are formed in the resin layer 78 by removing selectively the resin layer 78 chemically or mechanically. Respective surfaces of the base electrode 75, the emitter electrode 76, and the connecting electrodes 77 are exposed.

The exposed base electrode 75 and the connecting electrode 77 and the exposed emitter electrode 76 and the connecting electrode 77 are connected electrically via the connecting means 65 made of a metal film such as aluminum film, copper film, etc. For example, the connecting means 65 are formed on the resin layer 78, in which the contact holes are formed, via a resist mask to connect respective contact holes and respective electrodes selectively. Since a silicon, epoxy, or polyimide adhesive resin 79 is formed to cover the resin layer 78, the connecting means 65 are protected against the external circumstance.

Figure 7:
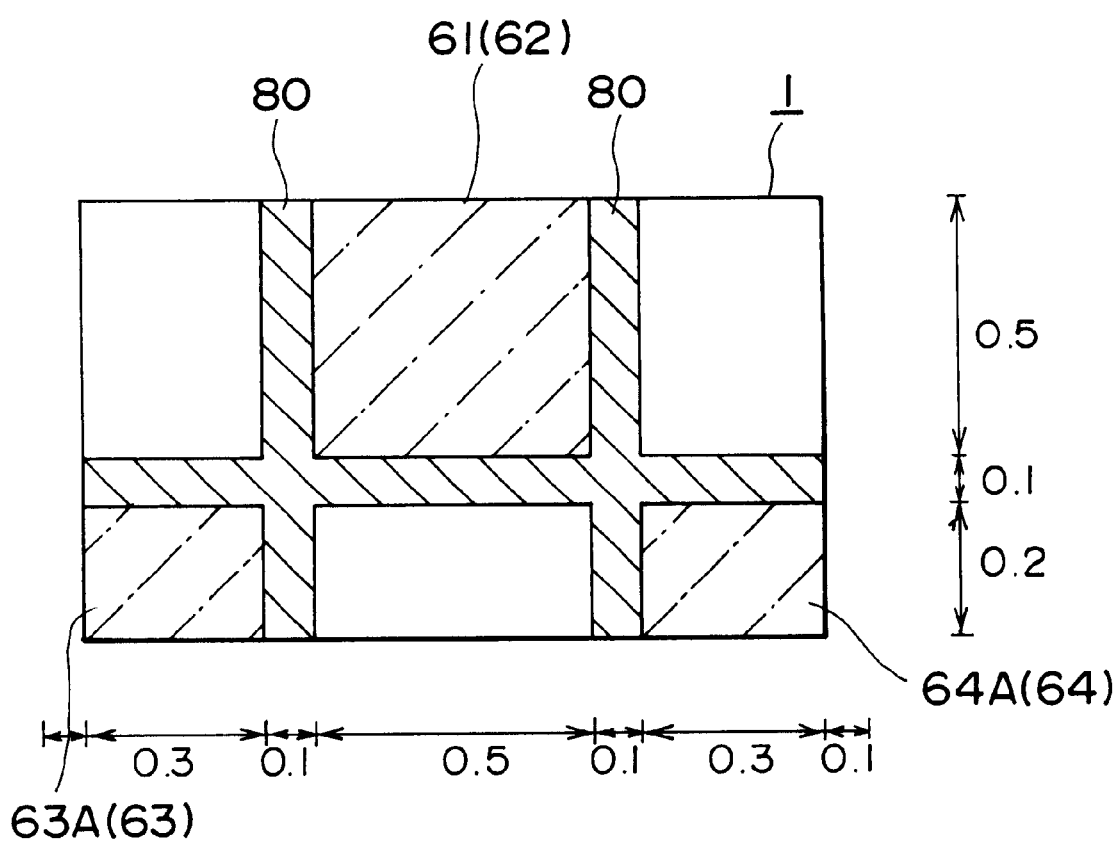
FIG. 7 is a rear view showing a rear surface of the semiconductor device according to the first embodiment of the present invention.

As shown in FIG. 7, the active device forming region 61 and the externally connecting electrode regions 63A, 64A formed on the same substrate are isolated electrically by slit holes 80 which are opened from the rear surface side of the semiconductor substrate 60 respectively. Respective isolated regions 61, 63A, 64A serve as externally connecting electrodes 62, 63, 64 of the transistor.

In other words, the semiconductor substrate 60 in the active device forming region 61 can act as the first external connecting electrode 62 for the collector electrode of the transistor, the semiconductor substrate 60 in the externally connecting electrode regions 64A can act as the third external connecting electrode 64 for the base electrode of the transistor, and the semiconductor substrate 60 in the externally connecting electrode regions 63A can act as the second external connecting electrode 63 for the emitter electrode of the transistor. As a result, with the use of the same semiconductor substrate 60, the external connecting electrodes 62, 63, 64 can be formed on the same plane.

The slit holes 80 for isolating electrically the external connecting electrodes 62, 63, 64 are opened from the rear surface side of the semiconductor substrate 60 to reach the resin layer 78. For the purposes of example, the slit holes 80 are opened by an optical method such as ion beam irradiation, laser beam irradiation, etc., a chemical method such as dry etching or wet etching, or a mechanical method using a dicing apparatus.

It is of importance that the slit holes 80 should be formed such that their top ends (bottom portions) are inserted into the resin layer 78 by a depth of about 2 to 6 $\mu$m to perfectly isolate electrically the external connecting electrodes 62, 63, 64. This is because, if the slit holes 80 are formed excessively shallow, such a disadvantage occurs that sufficient electric isolation between the external connecting electrodes 62, 63, 64 cannot be obtained to thus cause a short-circuit failure. The external connecting electrodes 62, 63, 64 are perfectly separated by the slit holes 80, but they are still held as a single body by the resin layer 78 to be placed on the same planar surface. If solder plating is formed on the surfaces of the external connecting electrodes 62, 63, 64, good solder connection can be made between the external connecting electrodes 62, 63, 64 and conductive patterns formed on the packaging substrate because the external connecting electrodes 62, 63, 64 are formed on the same planar surface.

After the slit holes 80 are opened in the semiconductor substrate 60 and the external connecting electrodes 62, 63, 64 of the transistor are electrically isolated, the semiconductor device is secured to pads made of conductive patterns formed on the packaging substrate such as ceramics substrate, glass epoxy substrate, phenol substrate, metal substrate being subjected to an insulating process, or the like and is then packaged. A solder layer in which a solder cream is printed and formed in advance is formed on the pads. Hence, if the semiconductor device of the present invention is mounted and then the solder cream is melted, the semiconductor device can be secured and packaged on the pads of the packaging substrate. Circuit elements with pasted solder such as chip capacitor, chip resistor, etc. can also be solder-secured by the same step.

In addition, when the semiconductor device of the present invention is mounted on the packaging substrate, mutual short-circuit between the external connecting electrodes 62, 63, 64 can be prevented because they are separated by a width of the slit holes 80.

As shown in FIG. 7, assume that the active device forming region 61 is 0.5 mm×0.5 mm in size, the external connecting electrode regions 63A, 64A serving as the emitter and base electrodes are 0.3 mm×0.2 mm in size respectively, a width of the slit hole 80 is 0.1 mm, a rate of an effective packaging area can be given in the following. That is, since the device area is 0.25 mm$^2$ and the area of the semiconductor device, i.e., the packaging area is 1.04 mm$^2$, a rate of an effective packaging area becomes about 24.04%.

A rate of an effective packaging area in the conventional chip size of 0.40 mm×0.40 mm is 6.25%. Therefore, a rate of an effective packaging area of the semiconductor device of the present invention is about 3.85 times as large as the semiconductor device in the prior art and thus the dead space in the packaging area can be reduced. These improvements are capable of contributing to miniaturization of the packaging substrate.

Figure 2:
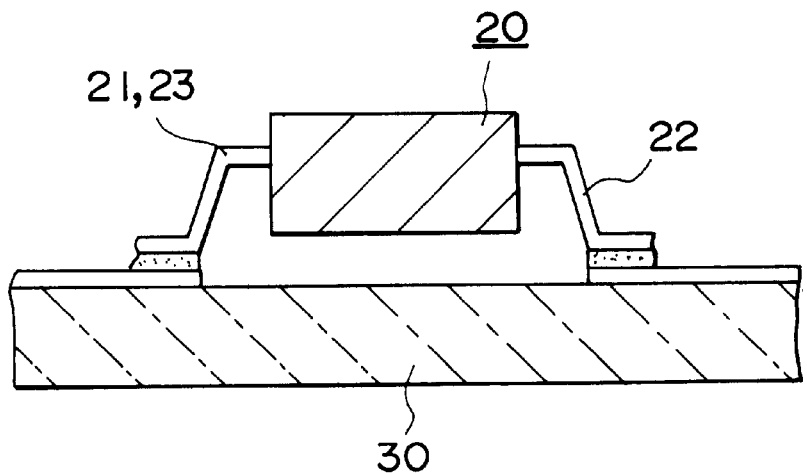
FIG. 2 is a sectional view showing the semiconductor device in the prior art which is packaged on a packaging substrate.
Figure 3:
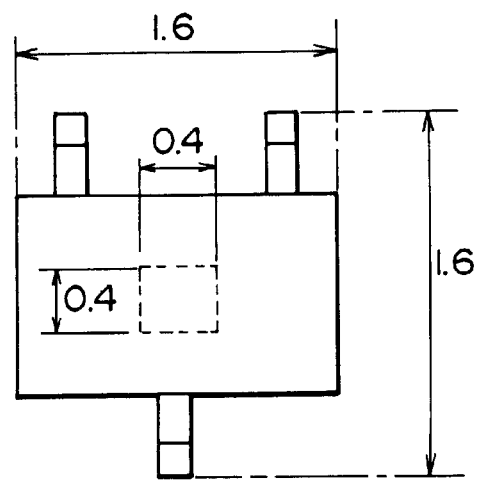
FIG. 3 is a plan view showing a semiconductor chip in the prior art.
Figure 4:
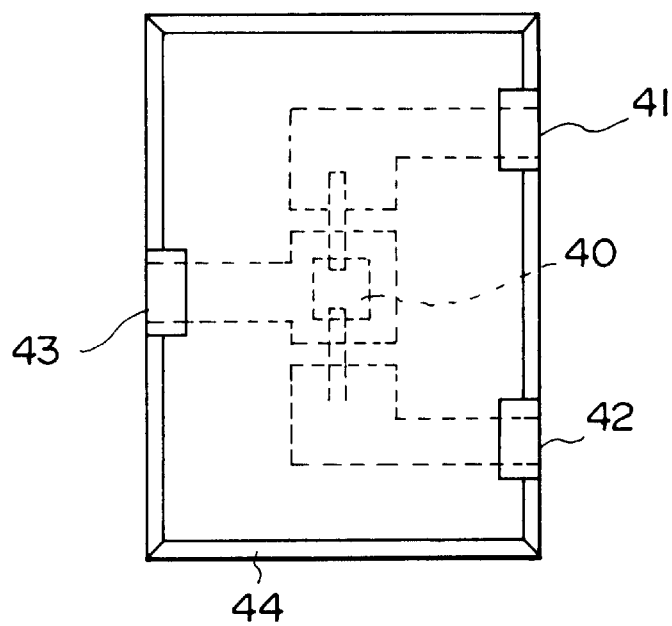
FIG. 4 is a plan view showing another semiconductor device in the prior art.
Figure 5:
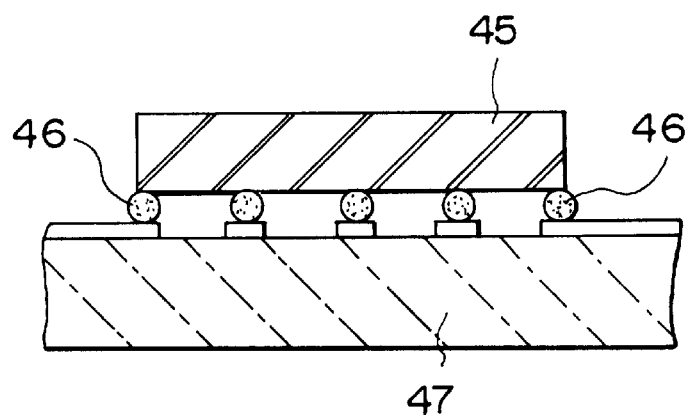
FIG. 5 is a schematic sectional view illustrating connection states in the semiconductor device in the prior art.

In the first embodiment, the external connecting electrodes 62, 63, 64 have been placed to form the triangle shape with regard to stability. However, if the external connecting electrodes 62, 63, 64 are aligned on a straight line, unused regions (unshaded regions in FIG. 2) of the semiconductor substrate 1 can be eliminated, so that a rate of an effective packaging area can be improved still further.

As described above, according to the present invention, if the transistor employing a part of the semiconductor substrate 60 as the external connecting electrode 62 for the collector electrode is formed on the semiconductor substrate 60 and another part of the semiconductor substrate 60 is employed as the external connecting electrodes 63, 64 for the emitter electrode 76 and the base electrode 75 respectively, the metal lead terminals connected to the external electrodes and the protection resin can be omitted, unlike the semiconductor device in the prior art, and outer dimensions of the semiconductor device can be significantly miniaturized.

In the first embodiment, although the transistor has been formed in the active device forming region 61, the present invention may also be applied to a vertical device or a lateral device with relatively small heat generation (e.g., power MOSFET, IGBT, HBT, etc.).

Figure 8:
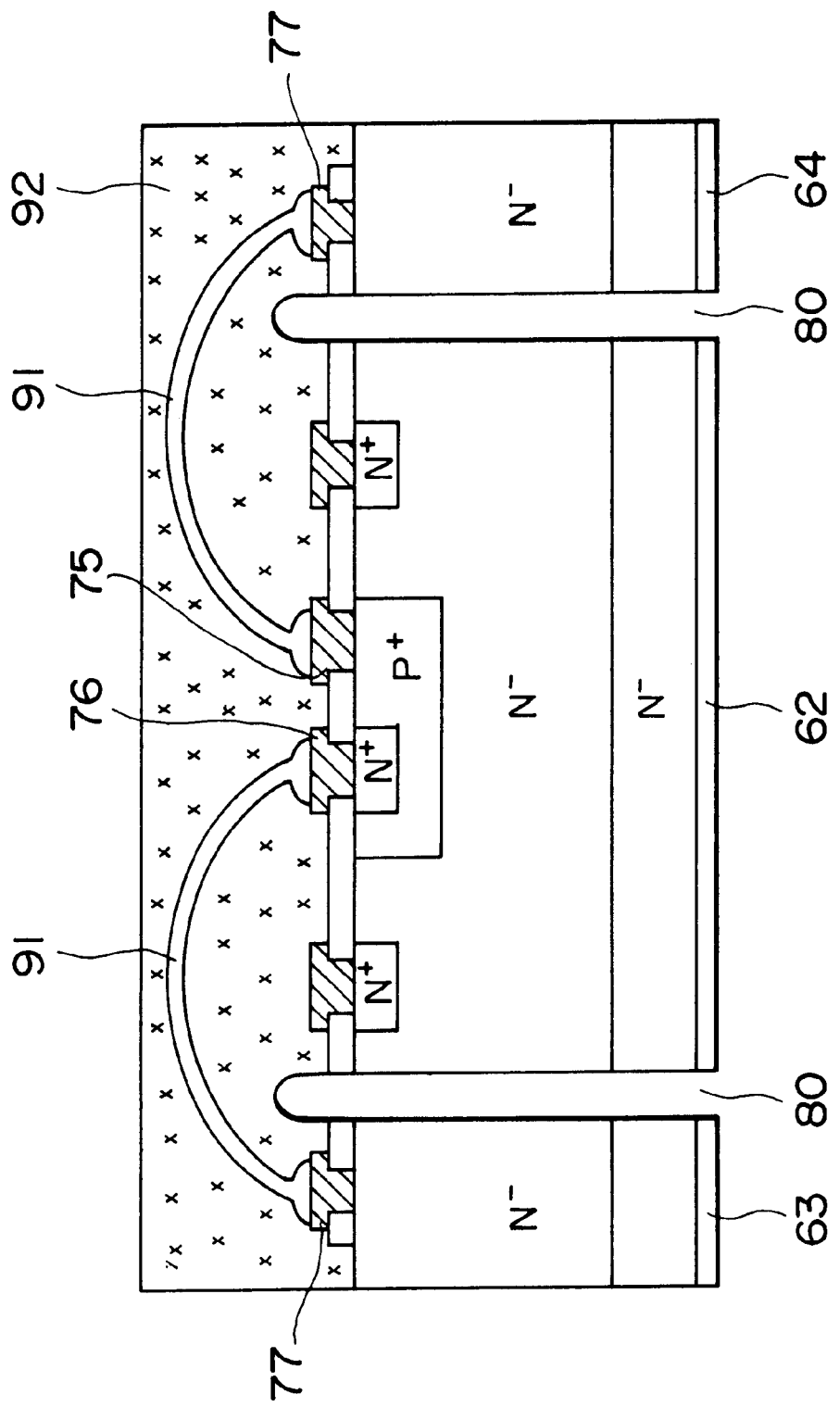
FIG. 8 is a sectional view showing a semiconductor device according to a modification of the first embodiment of the present invention.

Also in the first embodiment, although the metal wiring patterns formed on the resin layer 78 have been employed as the connecting means 65, as shown in FIG. 8, wires 91 made of aluminum, gold, etc. may be employed other than the metal wiring.

After the wires 91 are provided, an insulating resin 92 made of epoxy resin, polyimide resin, etc. is formed on the surface of the semiconductor substrate.

In the embodiment shown in FIG. 8, the surface of the device is covered with the insulating resin 92 to protect the surface, and then slit holes 80 are opened in the N− epitaxial layer 66 and the semiconductor substrate 60 to isolate the external connecting electrodes 62, 63, 64.

(2) Second Embodiment

A second embodiment of the present invention will be explained with reference to FIGS. 9 to 13 hereinafter.

Figure 9:
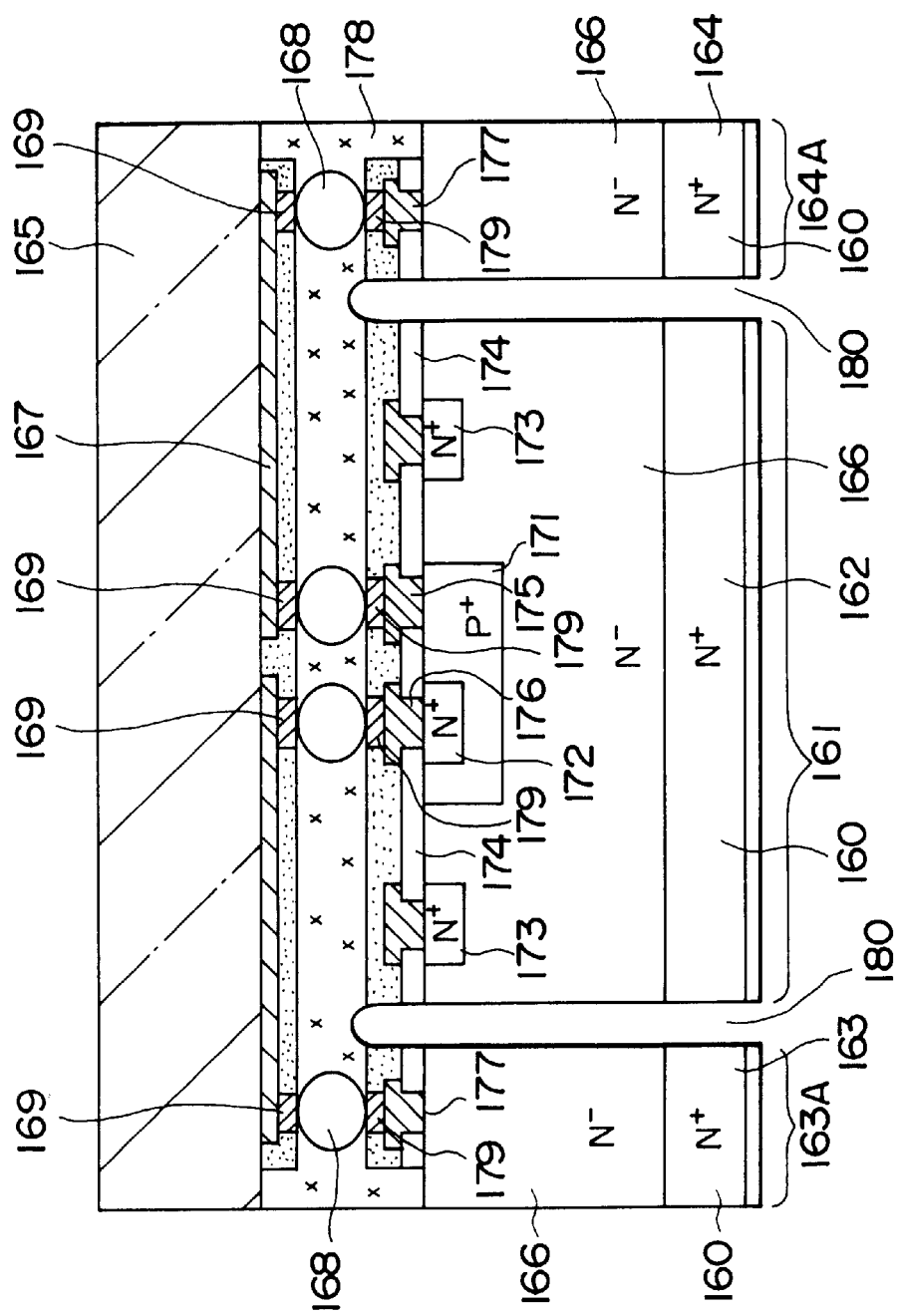
FIG. 9 is a sectional view showing a semiconductor device according to a second embodiment of the present invention.

As shown in FIG. 9, a semiconductor device according to the second embodiment comprises an active device forming region 161 which is made of a part of a semiconductor substrate 160 and in which an active device is formed; an active device formed in the active device forming region 161; an externally connecting electrode 162 provided to be connected to an external circuit:, etc.; externally connecting electrodes 163, 164 made of a part of the semiconductor substrate 160 respectively to be isolated electrically from the active device forming region 161; and a wiring substrate 165 on which wiring patterns for connecting electrodes of the active device to the externally connecting electrodes 163, 164 are formed.

The second embodiment is different from the first embodiment in that the wiring substrate 165 is employed in place of the adhesive resin 79, 92 employed in the first embodiment. Hence, references used in FIG. 9 are given by adding 100 to the references used in the first embodiment and, since the substantially identical configuration is used from the back surface of the semiconductor substrate to the insulating film 174, their explanations are omitted.

A base electrode 175, an emitter electrode 176, and connecting electrodes 177 are formed on a base region 171, an emitter region 172, electrode regions 163A, 164A, and a guard ring diffusion region 173 via an insulating film 174.

In the case that aluminum is employed to form the base electrode 175, the emitter electrode 176, and the connecting electrodes 177, a passivation film made of PSG, SiN, SiNx, etc. is formed on the semiconductor substrate 160, and then surfaces of the base electrode 175, the emitter electrode 176, and the connecting electrodes 177 are exposed by removing the passivation film on the base electrode 175, the emitter electrode 176, and the connecting electrodes 177 selectively.

Furthermore, a plating layer 179 made of chromium, copper, etc. is formed in exposed regions. This plating layer 179 is provided to prevent a disadvantage caused by corrosion of respective electrodes 175, 176, 177.

Figure 10:
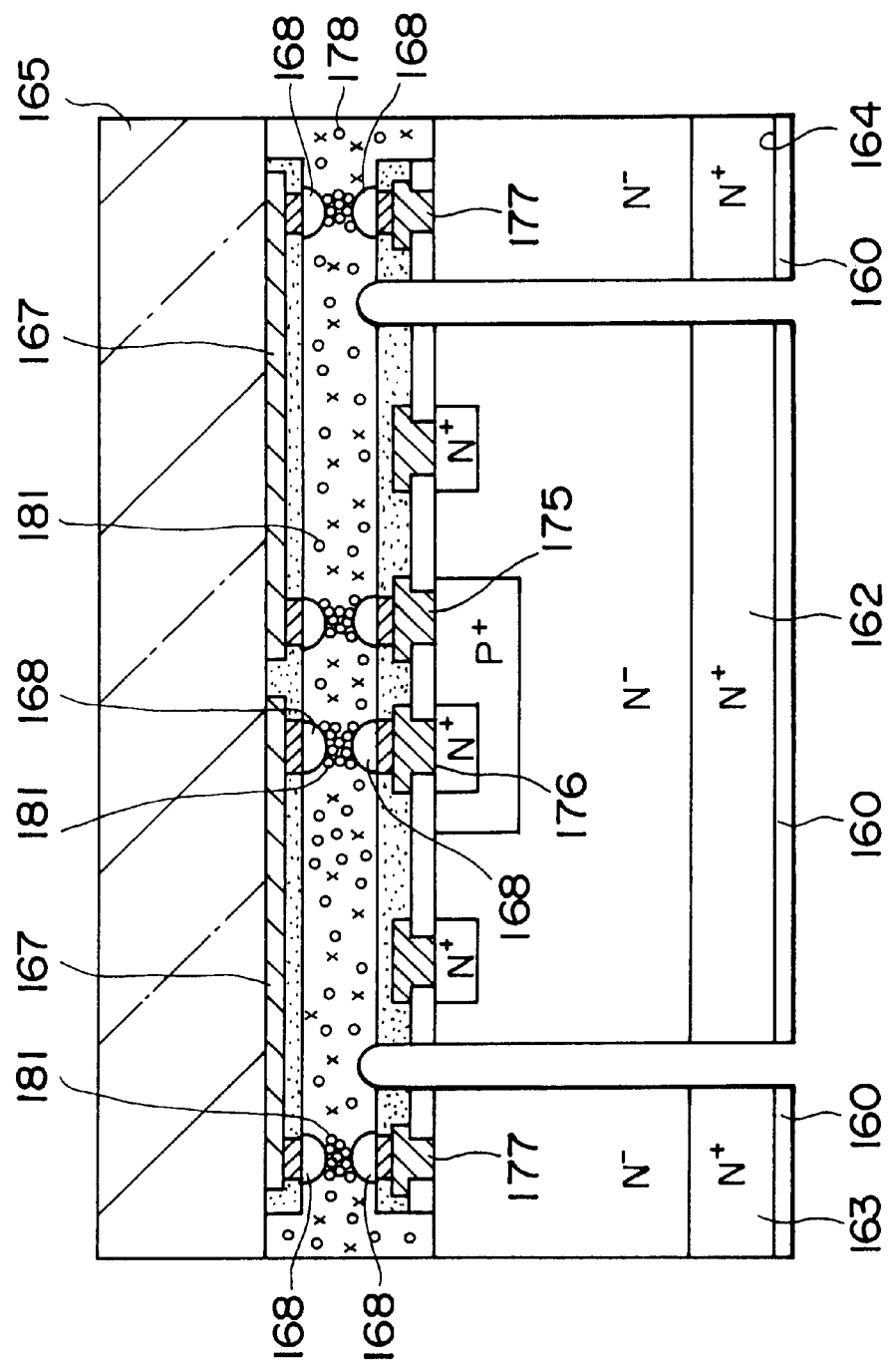
FIG. 10 is a first sectional view illustrating an electric conduction state of the semiconductor device according to the second embodiment of the present invention.

In the second embodiment, as shown in FIG. 10, an active device forming region 161 is formed in a central portion of the semiconductor substrate 160, and externally connecting electrode regions 163A, 164A are formed to constitute a triangle placement with respect to the active device forming region 161.

The wiring substrate 165 is secured to the surface of the semiconductor substrate 160 having the active device forming region 161, in which a transistor is formed, and the externally connecting electrode regions 163A, 164A thereon via either a silicon, epoxy, or polyimide insulating adhesive resin layer 178 or a photo-curing type insulating adhesive resin layer 178. The wiring patterns 167 made of aluminum, copper, etc. are formed on the wiring substrate 165. Electric connections between the base electrode 175 and the emitter electrode 176 of the transistor and the externally connecting electrode regions 163A, 164A are established via the wiring patterns 167 respectively.

Here, two following respects can be considered as major reasons why the silicon substrate is employed as the wiring substrate 165.

First, existing semiconductor manufacturing equipments can be used as they are and therefore there is no necessity of introducing new manufacturing equipments.

Second, since both the semiconductor substrate 160 and the wiring substrate 165 made of the silicon substrate have an equal thermal expansion coefficient a when the silicon substrate is secured to the semiconductor substrate 160, the same stresses are applied to both substrates so as to be canceled, and therefore harmful influence caused by distortion, especially cracks of the solder 168 can be prevented.

In case aluminum is employed as the wiring patterns 167, a passivation film made of insulating material such as PSG, SiN, or SiNx is formed on the wiring substrate 165 and surfaces of the wiring patterns 167 are exposed. in addition, plating layers 169 are formed by plating chromium, copper, or the like in the exposed regions selectively, then bump electrodes 168 made of gold, etc. are formed on the plating layers 169 to have a height of about 3 to 25 $\mu$m, and then electric conduction between the plating layers 169 and the connection electrodes 177 can be established by the bump electrodes 168.

Thermoset plastics such as epoxy resin may be used as the resin layer 178 to bond the semiconductor substrate 160 to the wiring substrate 165. Photo-curing and thermoset plastics is coated on the semiconductor substrate 160. Both the semiconductor substrate 160 and the wiring substrate 165 are then aligned so as to coincide the base electrode 175, the emitte r electrode 176, and the connecting electrodes 177 with the bump electrodes 168 formed on the wiring substrate 165 and then are come into tight contact with each other.

There after, heat ing treatment at about 80 to 100° C. is conducted to thermoset the resin layer 178 and thus to adhere both the semiconductor substrate 160 and the wiring substrate 165 together. At this time, respective electrodes 175, 176, 177 and the bump electrodes 168 are come into contact with each other to establish electric conduction therebetween. However, hardening of photo-curing resin in the resin layer 178 is th en started by irradiating the ultraviolet ray. Both the semiconductor substrates 160 and the wiring substrate 165 are attracted mutually by a shrinkage force caused when the photo-curing and thermoset plastics is hardened. Contact between respective electrodes 175, 176, 177 formed on the semiconductor substrate 160 and the bump electrodes 168 can be made tight.

In the meanwhile, it is preferable that, if a height of the bump electrodes 168 formed on the wiring patterns 167 is low, the bump electrodes are also formed on respective electrodes on the semiconductor substrate 160. See FIG. 6. If the height of the bump electrodes 168 formed on the wiring patterns 167 is too low, a separating distance between the semiconductor substrates 160 and the wiring substrate 165 becomes small, i.e., a film thickness of the resin layer 178 becomes thin. Therefore, when slits holes 180 described late rare formed, top end portions of the slits holes 180 reach a surface of the wiring substrate 165 to disconnect the wiring patterns 167. Thus the separating distance between the semiconductor substrates 160 and the wiring substrate 165 must be considered sufficiently.

As shown in FIG. 10, the semiconductor substrate 160 is electrically isolated into respective regions by the slit holes 180 which are formed from the back surface of the semiconductor substrate 160. Thus the externally connecting electrodes 162, 163, 164 connected to respective electrodes of the transistor are formed on the same planar surface.

The electrically separating slit holes 180 are formed from the back surface side of the semiconductor substrate 160 to reach the resin layer 178. For instance, the slit holes 180 are opened by an optical method such as ion beam irradiation, laser beam irradiation, etc., a chemical method such as dry etching or wet etching, or a mechanical method using a dicing apparatus.

It is of importance that the slit holes 180 should be formed such that their top ends (bottom portions) are inserted into the resin layer 178 by a depth of about 2 to 6 μm to perfectly isolate electrically the external connecting electrodes 162, 163, 164. This is because, if the slit holes 180 are formed too shallow, such a disadvantage occurs that sufficient electric isolation between the external connecting electrodes 162, 163, 164 cannot be obtained to thus cause a short-circuit failure. The external connecting electrodes 162, 163, 164 are still held and secured by the resin layer 178 to be placed on the same planar surface. A plating layer such as solder plating is formed on the surfaces of the semiconductor substrate 160 serving as the external connecting electrodes 162, 163, 164.

After the slit holes 180 are opened in the semiconductor substrate 160 to electrically isolate the external connecting electrodes 162, 163, 164 of the transistor, the semiconductor device is secured to conductive pads formed on the packaging substrate (e.g., ceramics substrate, glass epoxy substrate, phenol substrate, metal substrate being subjected to an insulating process, or the like) and is then packaged. A solder layer in which a solder cream is printed and formed in advance is formed on the conductive pads. Hence, if the semiconductor device of the present invention is mounted and then the solder cream is melted, the semiconductor device can be secured and packaged on the conductive pads of the packaging substrate.

As shown in FIG. 10, in the semiconductor device of the present invention, since the device area is 0.25 mm² and the area of the semiconductor device, i.e., the packaging area is 1.04 mm², a rate of an effective packaging area becomes about 24.04%, as in the first embodiment.

In the second embodiment, electric conduction between respective electrodes of the semiconductor substrate 160 and wiring patterns on the wiring substrate 165 has been taken with the use of thermoset resin as the resin layer 178. But such electric conduction between them can be applied to any devices in the second embodiment. For instance, as shown in FIG. 6, if an anisotropic conductive plastic is employed as the resin layer 178, electric conduction between respective electrodes of the semiconductor substrate 160 and wiring patterns on the wiring substrate 165 can be easily obtained.

There are two type anisotropic conductive plastics, i.e., an anisotropic conductive plastic obtained by mixing grain conductors 181 into a resin paste and an anisotropic conductive plastic obtained by scattering grain conductors 181 into a resin sheet. Either type anisotropic conductive plastic can be used. If the anisotropic conductive plastic is used, it is preferable to form the bump electrodes 168 on respective electrodes 175, 176, 177 on the semiconductor substrate 160 and the wiring patterns 167 on the wiring substrate 165.

For example, the anisotropic conductive sheet is placed on the semiconductor substrate 160, then the bump electrodes 168 on the wiring substrate 165 are aligned to coincide with the bump electrodes 168 on the semiconductor substrate 160, and then the semiconductor substrate 160 and the wiring substrate 165 are heated at about 120° C. to melt the conductive sheet into the resin layer 178 while applying a predetermined pressure to both substrates 160, 165. Thus electric conduction between respective electrodes 175, 176, 177 and the wiring patterns 167 can be achieved by the conductor 181.

Figure 11:
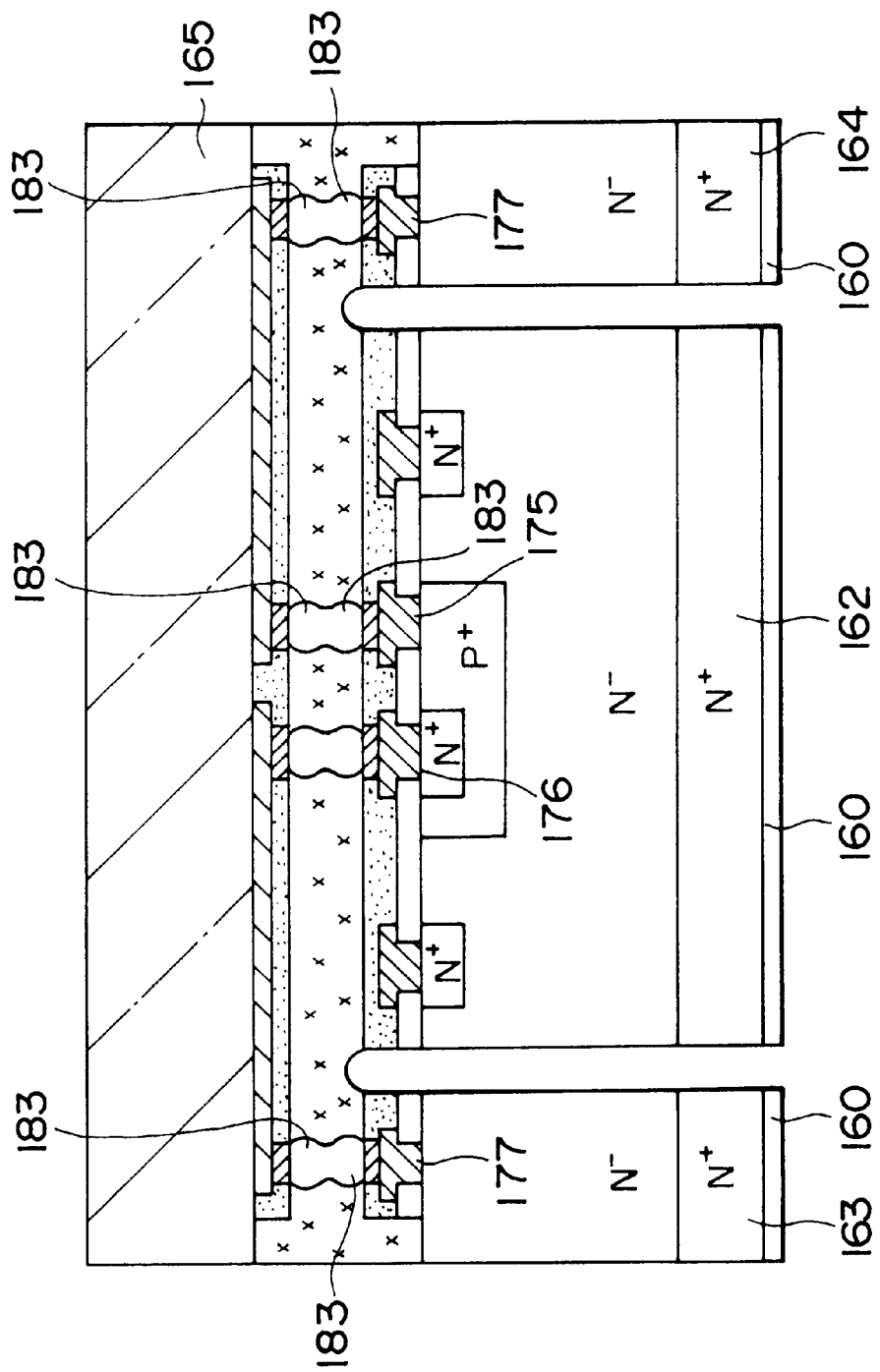
FIG. 11 is a second sectional view illustrating another electric conduction state of the semiconductor device according to the second embodiment of the present invention.

As another electric conduction approach, as shown in FIG. 11, the semiconductor substrate 160 and the wiring substrate 165 are aligned to coincide the bump electrodes 183, 183 formed on both the semiconductor substrate 160 and the wiring substrate 165 mutually, and then the bump electrodes 183, 183 are melted to achieve electric conduction between respective electrodes 175, 176, 177 on the semiconductor substrate 160 and the wiring patterns 167 on the wiring substrate 165. Thereafter, impregnant made of liquid thermoset resin is filled into a clearance between both substrates 160, 165 while applying a pressure to both substrates 160, 165, then the resin layer 178 is formed by heat treatment, and then the slit holes 180 are opened.

In the present invention, if respective electrodes 175, 176, 177 and the wiring patterns 167 are connected, any configuration and any material may be employed.

Further, in the second embodiment, the similar advantages to the first embodiment together with the above advantages can be achieved.

In the first and second embodiments described above, a principal object is to utilize the back surface of the semiconductor substrate as the electrodes to thus reduce the chip size, as described at the beginning of the embodiments, but various improvements or modifications may be made as explained hereunder.

Figure 12:
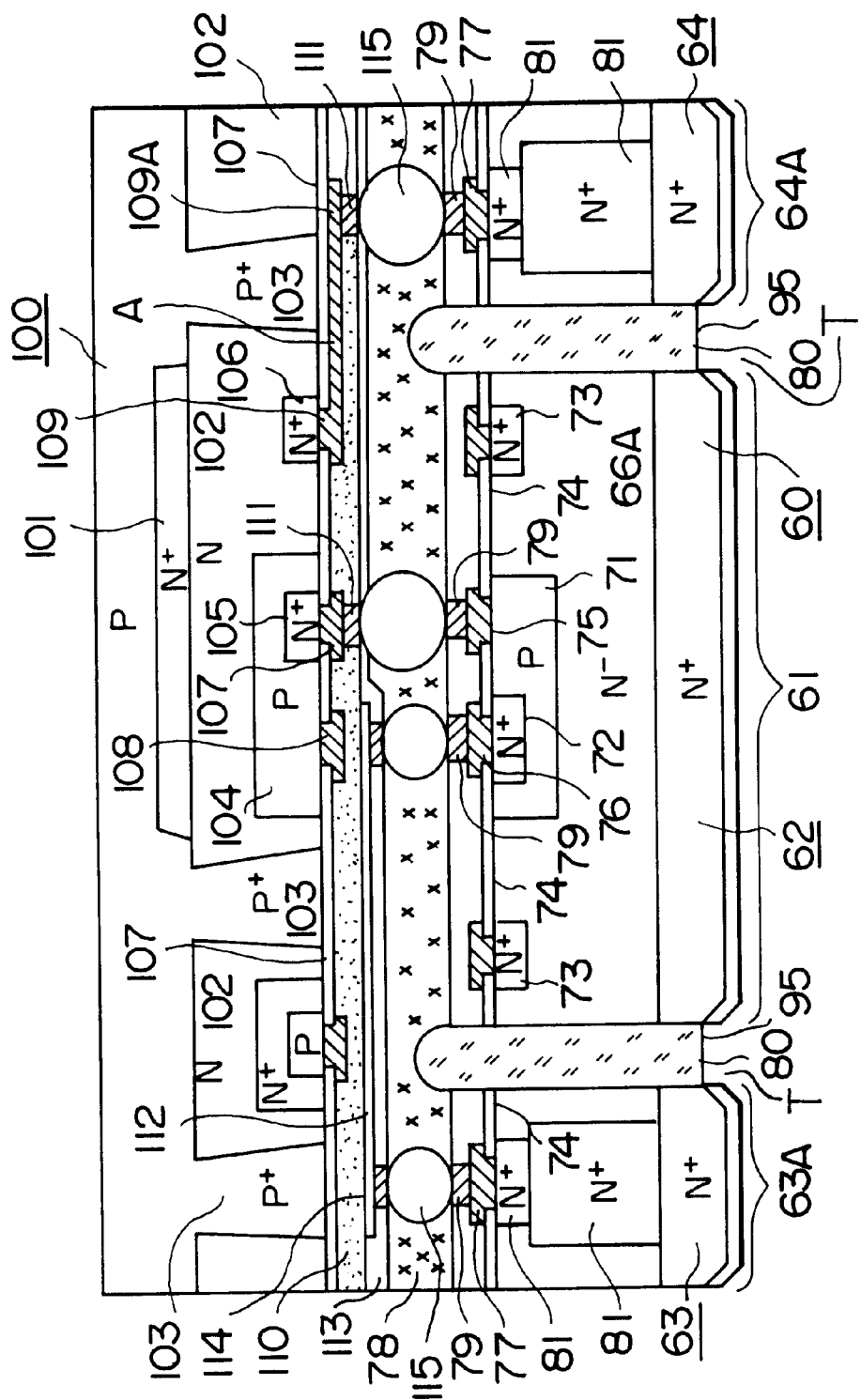
FIG. 12 is a sectional view illustrating first to fourth improvements in a configuration of the semiconductor device according to the second embodiment of the present invention.

FIG. 12 is a view showing various improvements of the present invention. A first improvement resides in a respect that an IC substrate 100 into which a plurality of semiconductor devices are incorporated is employed in place of the wiring substrate 165 in FIGS. 9 and 10. BipIC is employed herein. A control circuit for the switching device which is formed in the active device forming region 61 is incorporated into the IC substrate 100 to therefore achieve a complex high ability semiconductor device.

A second improvement is to form an N+ high impurity concentration diffusion regions 81 in the externally connecting electrode regions 63A, 64A, 163A, 164A in FIGS. 6 and 9. Such diffusion regions 81 can be easily achieved if a method of forming isolation regions used in BipIC is adopted. The diffusion regions 81 may be diffused from the surface of the epitaxial layer to the substrate, otherwise the diffusion regions 81 may be diffused between the substrate and the epitaxial layer and vertically from the surface of the epitaxial layer. The diffusion regions 81 has such merits that its resistance can be reduced because of its high impurity diffusion and power loss can be reduced.

A third improvement is to form taper portions T provided on edges of the externally connecting electrodes. If the externally connecting electrodes with the taper portions T are coupled to conductive pads on the packaging substrate via solder, solder fillet can be made large in size and coupling areas can be made large. Hence, coupling strength and connection reliability can be improved. The taper portions T can be formed as shown in FIG. 12 if first edges of the externally connecting electrodes are diced shallow by a trapezoid dicing blade and then diced by a narrow width blade.

A fourth improvement is to fill insulating resin layers 95 into the slit holes 80. The insulating resin layers 95 can assure insulation between the externally connecting electrodes 62, 63, 64 and also improve mutual adhesive strength.

Figure 13:
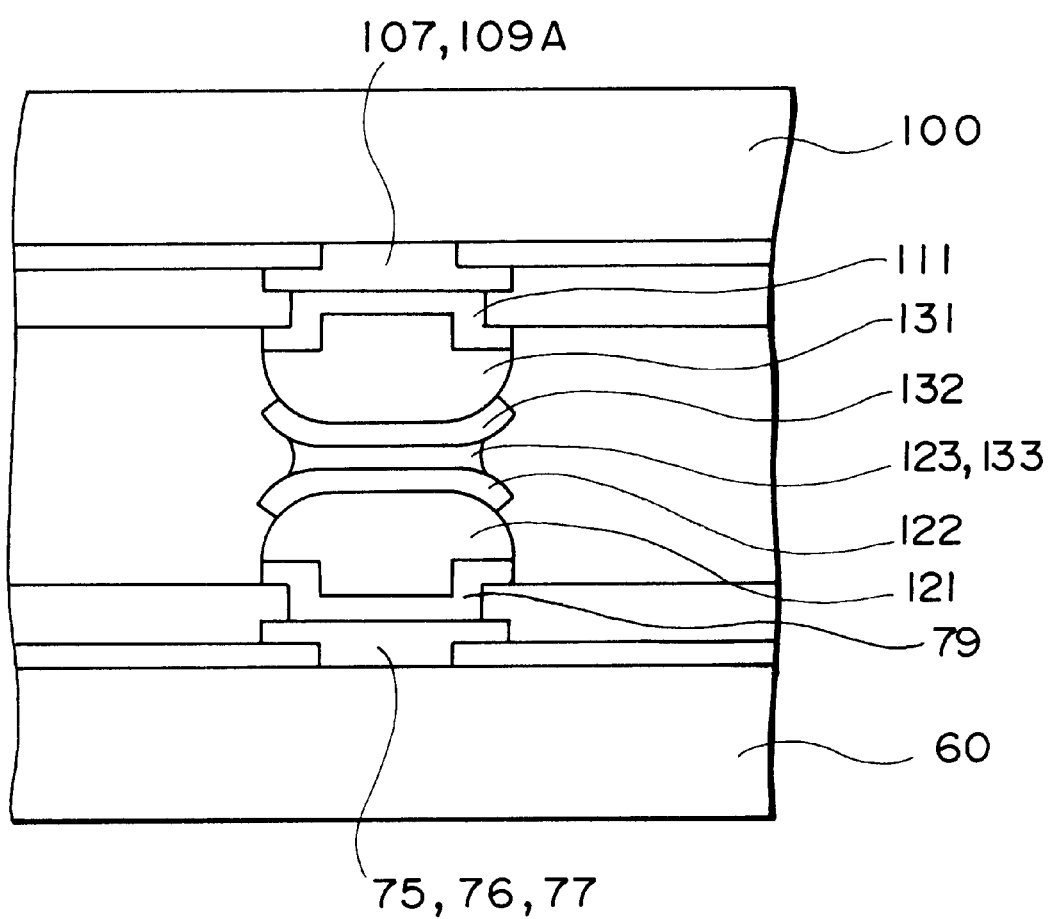
FIG. 13 is a sectional view illustrating a fifth improvement in the configuration of the semiconductor device according to the second embodiment of the present invention.

Subsequently, a fifth improvement resides in a respect that metal bumps 115 in FIG. 12 is modified to those in FIG. 13. The metal bumps 115 are suitable for the case where the first substrate 60 and the second substrate 100 are made of the same material and no thermal expansion distortion is applied to them. That is, if thermal distortion occurs, it is preferable to have such a configuration that gold bumps 121, 131 are formed separately, as shown in FIG. 13 so that thermal distortion can be absorbed by flexible Au bumps.

In the opening portions of the passivation (74A), (110) exposing the electrodes (75, 76, 77), (107, 109A), a first barrier metal (79), (111) to which chromium, copper, titanium, or the like is adhered is formed and then a gold bump (121), (131) is formed thereon. Then a second barrier metal (122), (132) to which chromium, copper, titanium, or the like is adhered is formed thereon. Conjunction layers 123, 133 made of AuSn are provided on the second barrier metal (122), (132).

Since these materials are connected on the packaging substrate by solder, materials having a melting point higher than a melting point 170 to 190° C. of solder must be used. On the contrary, the conjunction layers 123, 133 must have a melting point lower than a melting point of the bump electrode. In other words, respective melting points of gold bump and AuSn are 1063 and 370° C. Hence, upper and lower conjunction layers 123, 133 are melted and connected to each other when the semiconductor device of the present invention is heated up to 370° C.

If the conjunction layers 123, 133 are melted without barrier metal, Sn enters into the gold bumps 121, 131 to lower the melting point so that two gold bumps constitute one gold bump. Hence, the problem has arisen that an interval between the second substrate 100 and the first substrate 60 is made narrow. Namely, only the conjunction layers 123, 133 can be melted because of the presence of the barrier metals.

(3) Third Embodiment

A third embodiment of the present invention will be explained with reference to FIGS. 14 to 19 hereinafter. In the third embodiment, a method of manufacturing the semiconductor device according to the second embodiment will be explained in detail.

Figure 14:
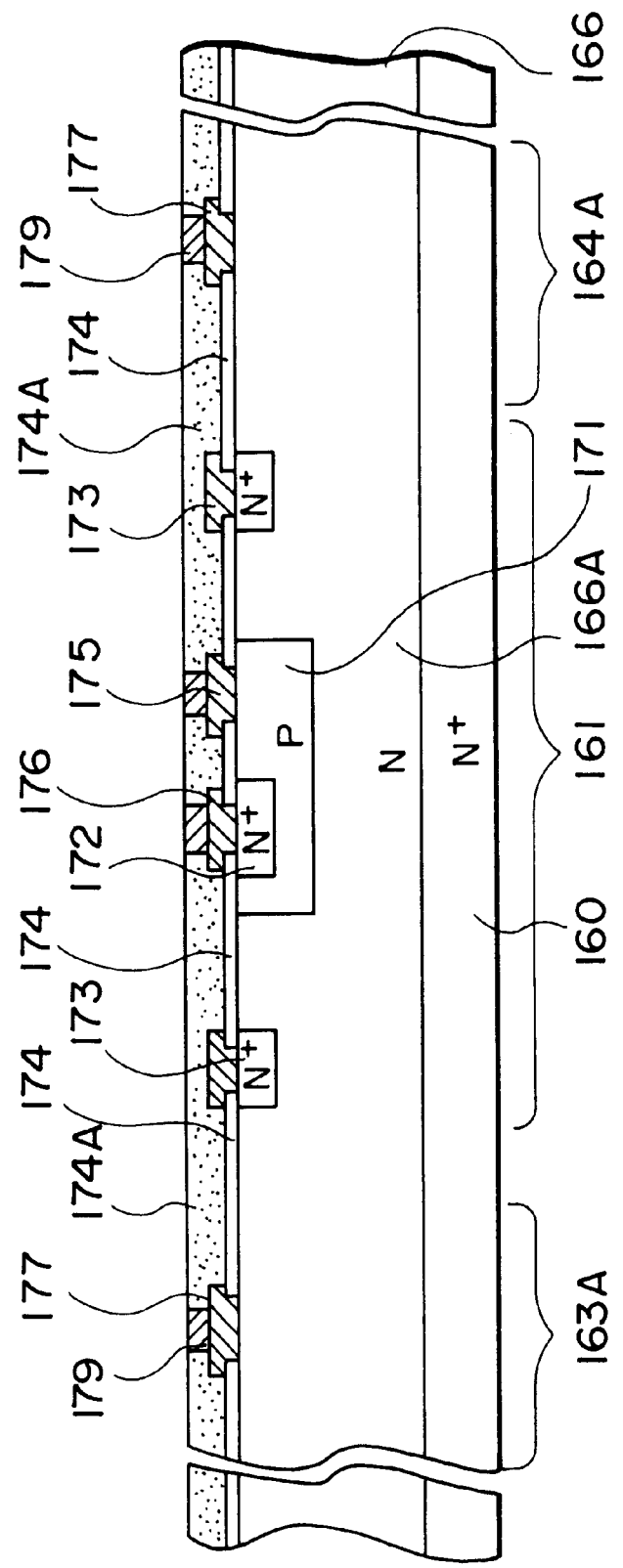
FIG. 14 is a first sectional view illustrating a method of manufacturing a semiconductor device according to a third embodiment of the present invention.
Figure 18:
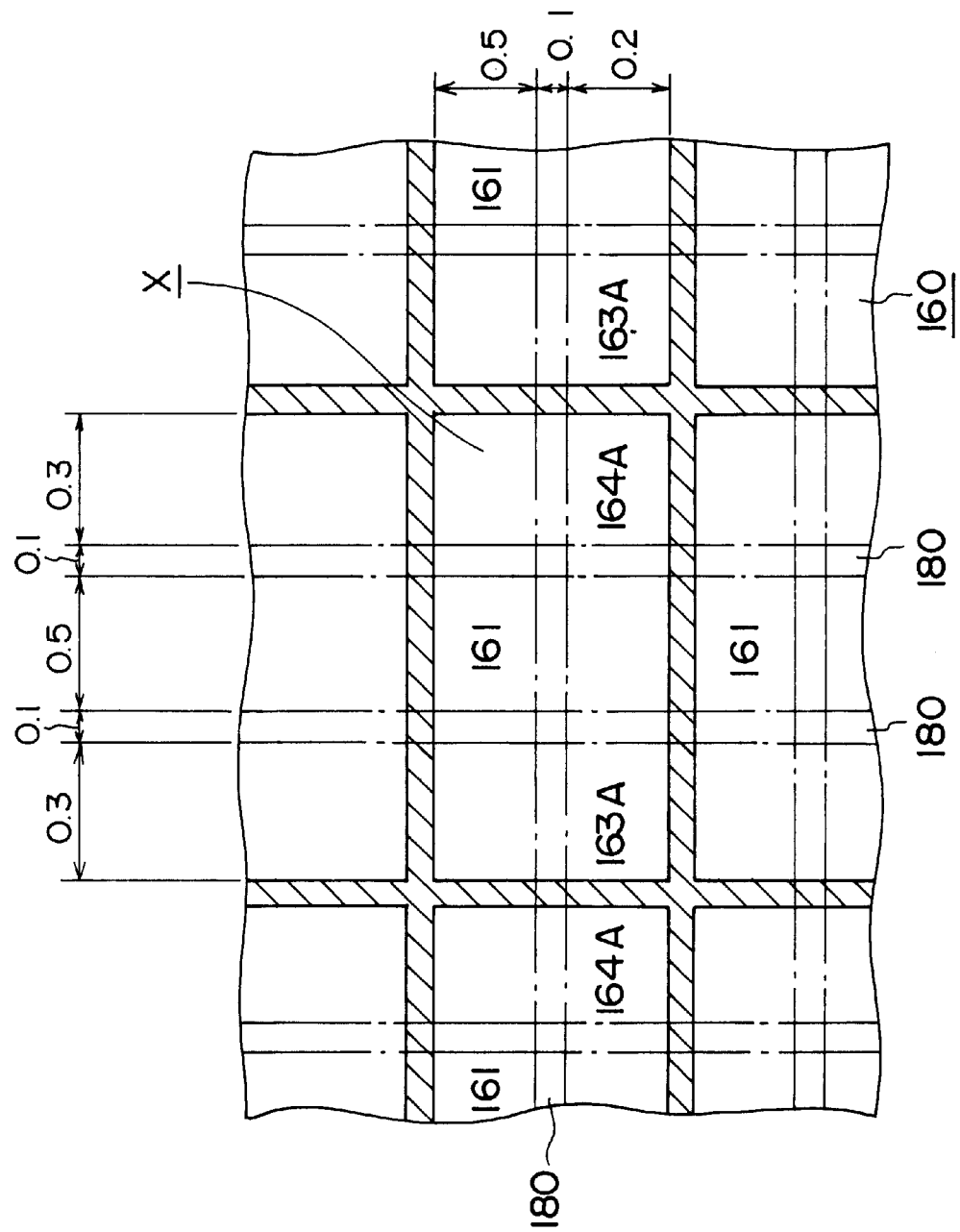
FIG. 18 is a fifth sectional view illustrating the method of manufacturing the semiconductor device according to the third embodiment of the present invention.

At first, as shown in FIG. 14, an N- epitaxial layer 166 is formed by an epitaxial growth method on a wafer-like semiconductor substrate 160 made of an N+ single crystal silicon substrate. Active device forming regions 161, in which an active device such as power MOS, transistor, etc. is formed, and externally connecting electrode regions 163A, 164A, which serve as externally connecting electrodes 163, 164 connected to respective electrodes of the active device, are regularly arranged on the semiconductor substrate 160, as shown in FIG. 18.

The above active device is formed in the active device forming regions 161. Since the method of manufacturing this active device has been well known and is not a key point of the third embodiment, its explanation will be omitted.

A silicon oxide film 174 having therein a base contact hole, from which a surface of the base region 171 is exposed, and an emitter contact hole, from which a surface of the emitter region 172 is exposed, is formed on the surface of the N- epitaxial layer 166. A guard ring contact hole from which a surface of the guard ring diffusion region 173 is also formed. This insulating film 174 is formed on the electrode regions 163A, 164A serving as the externally connecting electrodes and has externally connecting contact holes for exposing a surface of the electrode regions 163A, 164A.

A base electrode 175, an emitter electrode 176, connecting electrodes 177, and a guard ring 173 are formed by depositing selectively metal material such as aluminum respectively on the base region 171, the emitter region 172, the electrode regions 163A, 164A, and the guard ring diffusion region 173, which are exposed from a base contact hole, an emitter contact hole, externally connecting contact holes, and a guard ring contact hole.

In the case that aluminum is employed to form the base electrode 175, the emitter electrode 176, and the connecting electrodes 177, a passivation film 174A made of insulating material such as PSG, SiN, SiNx, etc. is formed on the semiconductor substrate 160, and then surfaces of the base electrode 175, the emitter electrode 176, and the connecting electrodes 177 are exposed by removing selectively the passivation film 174A on the base electrode 175, the emitter electrode 176, and the connecting electrodes 177.

Furthermore, a plating layer 179 is formed by plating selectively chromium, copper, etc. on respective electrodes 175, 176, 177 in the above exposed regions. This plating layer 179 is provided to prevent a disadvantage caused by corrosion of respective electrodes 175, 176, 177.

Figure 15:
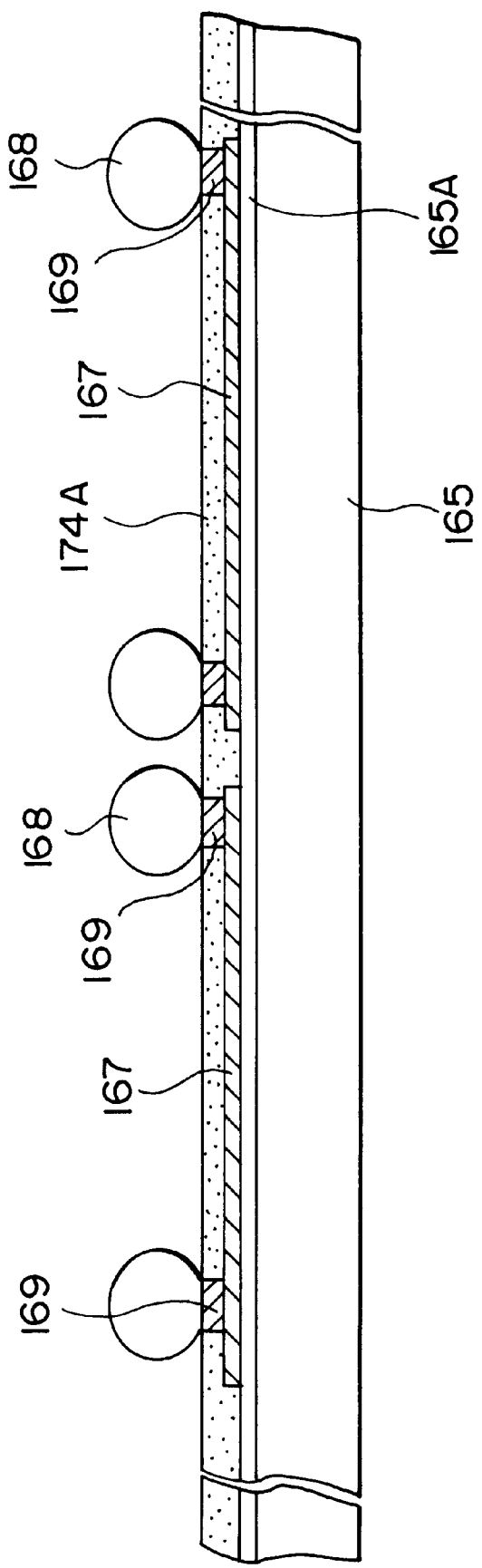
FIG. 15 is a second sectional view illustrating the method of manufacturing the semiconductor device according to the third embodiment of the present invention.

Next, as shown in FIG. 15, a wiring substrate 165 is prepared, which is secured to the surface of the semiconductor substrate 160 via either a silicon, epoxy, or polyimide insulating adhesive resin layer 178 or a photo-curing type insulating adhesive resin layer 178. Wiring patterns 167 made of aluminum, copper, etc. are formed on the wiring substrate 165. Electric connections between the base electrode 175 and the emitter electrode 176 of the transistor and the externally connecting electrode regions 163A, 164A are established via the wiring patterns 167 respectively.

As the wiring substrate 165, glass epoxy substrate, ceramics substrate, metal substrate being subjected to an insulating process, phenol substrate, silicon substrate, or the like may be employed. For instance, if the silicon substrate is employed as the wiring substrate 165, an insulating layer 165A such as SiO2, SiNx, etc. is formed on its surface, then a metal such as aluminum is deposited selectively on the insulating layer 165A to form the wiring patterns 167 with predetermined profiles.

It is preferable that the silicon substrate is employed as the wiring substrate 165 because of two major reasons described above.

In the event that aluminum is employed as the wiring patterns 167, as described above, a passivation film 174A made of an insulating material such as PSG, SiN, SiNx, etc. is formed on the wiring substrate 165, and then the passivation film 174A formed on the wiring patterns 167 is selectively removed to expose surfaces of the wiring patterns 167 on which the bump electrodes 168 are formed. Then plating layers 169 are formed by plating selectively chromium, copper, etc. in the exposed regions. Then bump electrodes 168 made of metal such as gold are formed on the plating layers 169 to have a height of about 3 to 25 μm. The bump electrodes can be formed according to the well known method. The wiring patterns 167 are come into contact with the connecting electrodes 177, which are formed on the externally connecting electrode regions 163A, 164A, via the bump electrodes 168 to establish electric connection therebetween.

Figure 16:
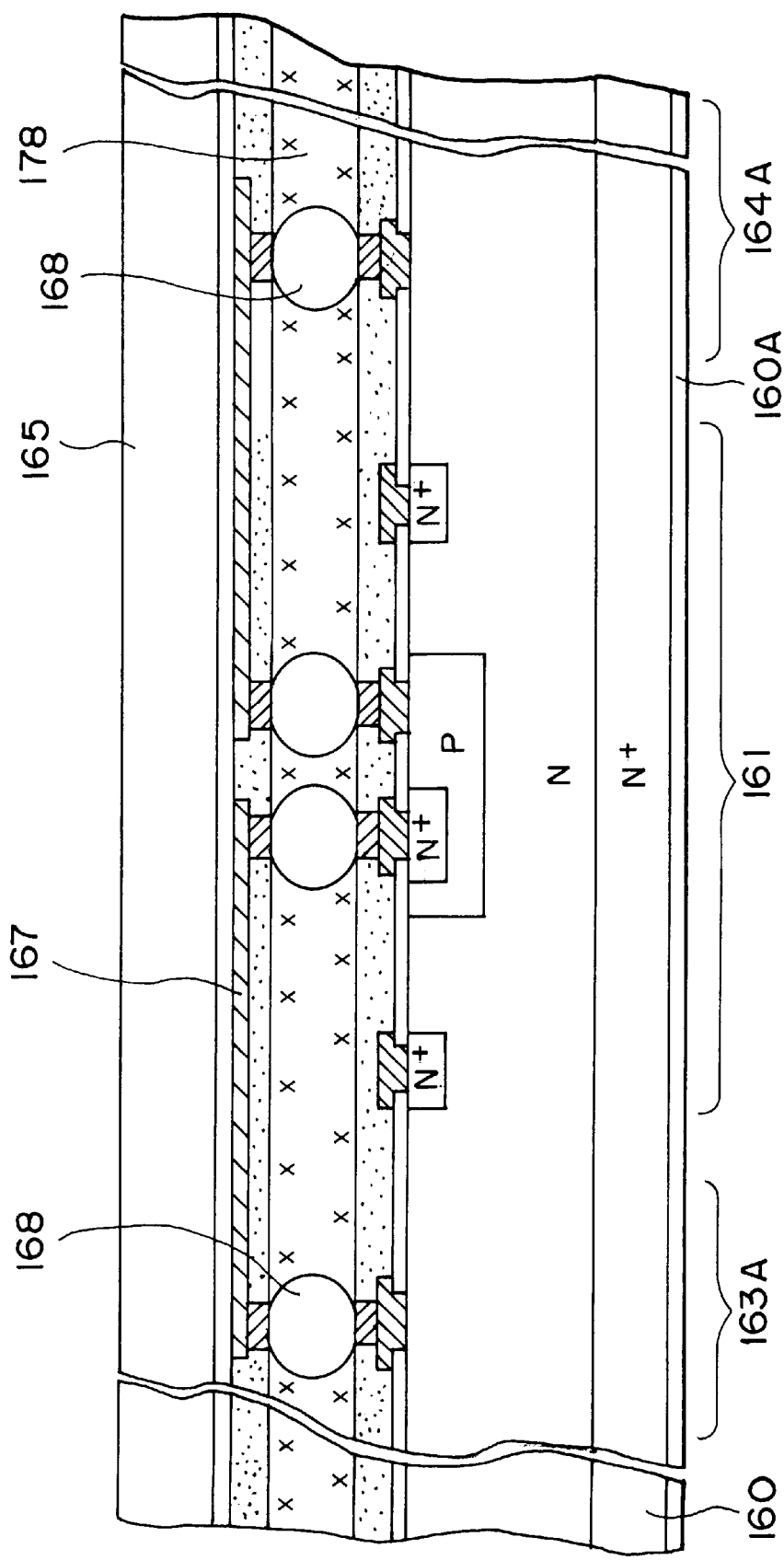
FIG. 16 is a third sectional view illustrating the method of manufacturing the semiconductor device according to the third embodiment of the present invention.

Next, as shown in FIG. 16, the semiconductor substrate 160 and the wiring substrate 165 are adhered via the resin layer 178. Various materials are present as the resin layer 178, as described above, and thermoset plastics such as epoxy resin may be employed as the resin layer 178, for example. The thermoset plastics is then coated on the semiconductor substrate 160. Both the semiconductor substrate 160 and the wiring substrate 165 are aligned and tightly connected such that the base electrode 175 and the emitter electrode 176 of the transistor formed on the active device forming region 161 and the connecting electrodes 177, 179 formed in the externally connecting electrode regions 163A, 164A coincide with the bump electrodes 168 formed on the wiring substrate 165.

After this, heating treatment at about 80 to 100° C. is conducted to thermoset the resin layer 178 and thus to adhere both the semiconductor substrate 160 and the wiring substrate 165 together. At this time, respective electrodes 175, 176, 177 and the bump electrodes 168 are come into contact with each other to establish electric conduction therebetween.

Then hardening of the resin layer 178 is started by heating. Both the semiconductor substrates 160 and the wiring substrate 165 are attracted mutually by a shrinkage force caused when the resin layer 178 is hardened. Respective electrodes 175, 176, 177 formed on the semiconductor substrate 160 and the bump electrodes 168 can be sufficiently come into contact, and therefore electric conduction between them can be made sure. The resin layer 178 can render electric conduction between respective electrodes 175, 176, 177 and the bump electrodes 168 good and simultaneously adhere both substrates 160, 165.

However, as has explained in the fifth improvement, the upper and lower substrates may be bonded together by forming the metal bumps on respective substrates and melting the conjunction layers.

After both substrates 160, 165 are stuck by the resin layer 178, a plating layer 160A is formed on the back surface of the substrate 160 by virtue of metal plating process such as solder. This plating layer 160A acts to improve connection to solder when the device is mounted on the packaging substrate.

Figure 17:
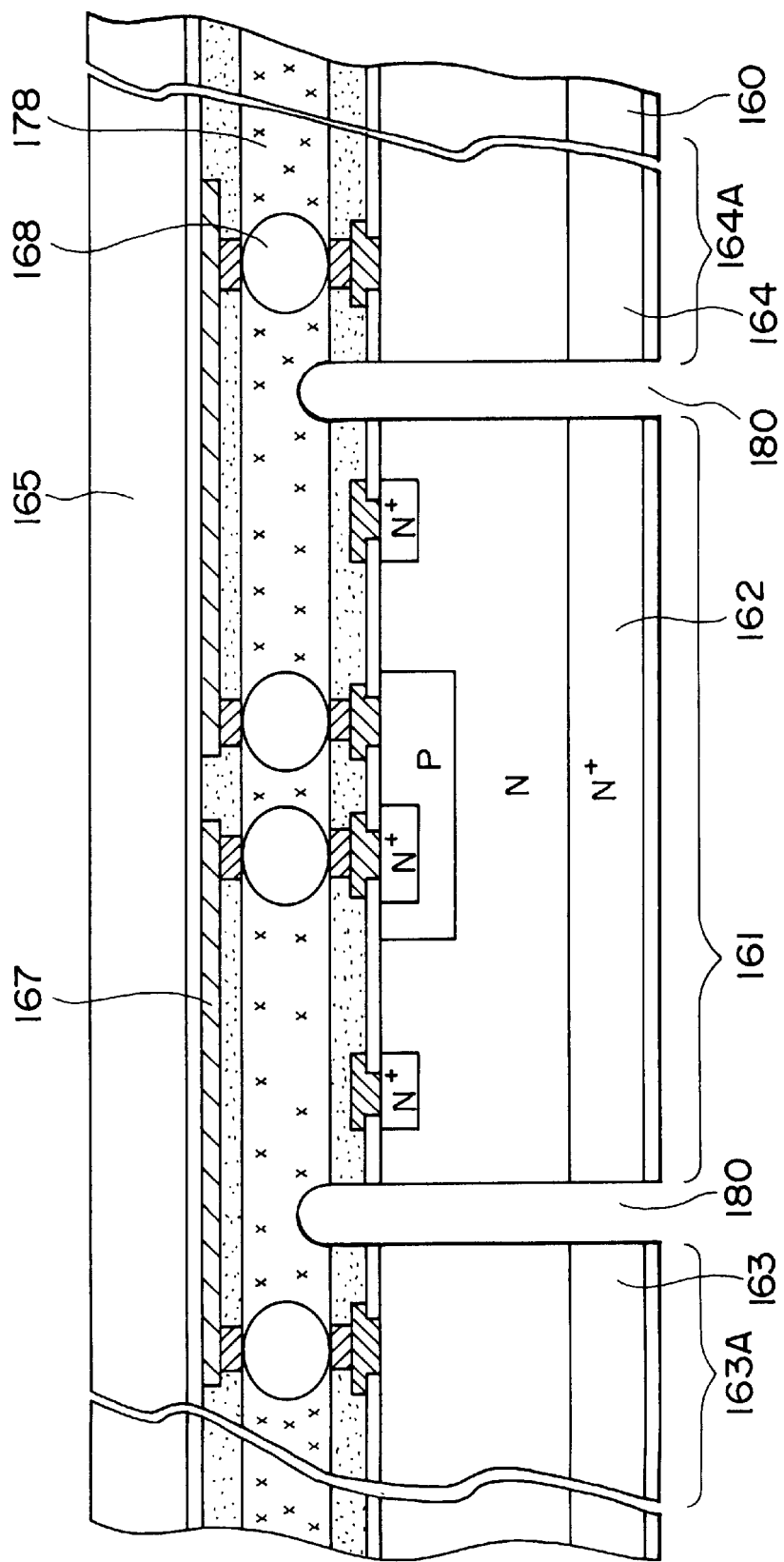
FIG. 17 is a fourth sectional view illustrating the method of manufacturing the semiconductor device according to the third embodiment of the present invention.
Figure 19:
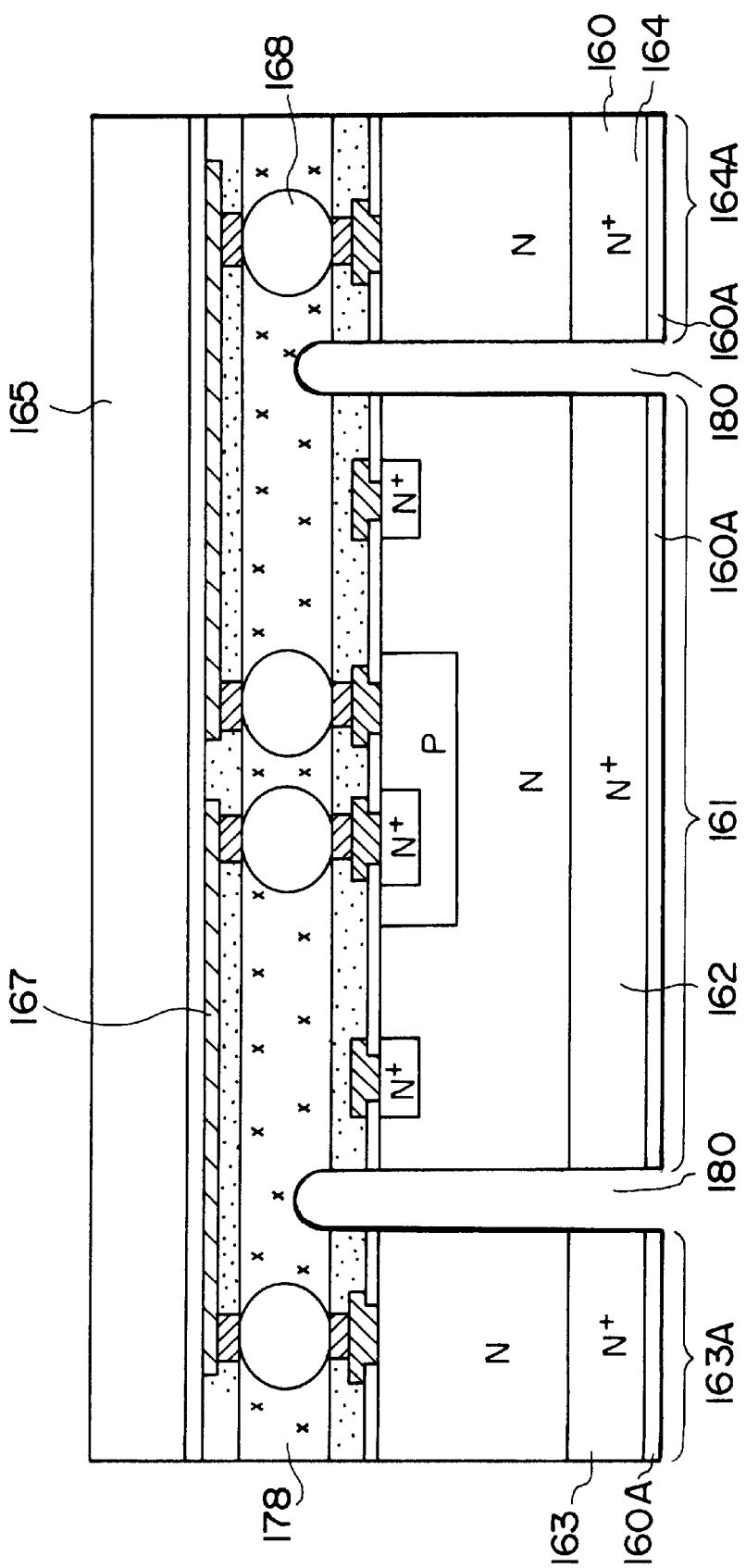
FIG. 19 is a sixth sectional view illustrating the method of manufacturing the semiconductor device according to the third embodiment of the present invention.

Subsequently, as shown in FIGS. 17 and 19, the active device forming region 161 formed on the substrate 160 and the externally connecting electrode regions 163A, 164A are electrically isolated by slit holes 180 which are formed from the back surface side of the semiconductor substrate 160. In addition, since the semiconductor device is formed by use of the same semiconductor substrate 160, the externally connecting electrodes 162, 163, 164 connected to respective electrodes of the transistor are formed on the same planar surface.

The slit holes 180 for electrically isolating the externally connecting electrodes 162, 163, 164 are formed from the back surface of the semiconductor device 160 to reach the resin layer 178. The slit holes 180 can be formed by the mechanical method using the dicing apparatus.

The reasons why the slit holes 180 are formed by using the dicing apparatus are that a width and a depth of dicing can be controlled with good precision and that the existing equipment can be used and there is no necessity of purchasing a new machine. The dicing width can be set according to a width of a dicing blade and the dicing depth has, though different by dicing apparatus makers, a precision error of about 2 to 5 μm in the current technology. Therefore, the active device forming region 161 and the externally connecting electrode regions 163A, 164A can be electrically isolated firmly without cutting-off of the wiring patterns 167 on the wiring substrate 165.

As shown in FIG. 18, according to such a dicing step, a step of electrically isolating the active device forming region 161 formed on the semiconductor substrate 160 from the externally connecting electrode region 164A serving as the externally connecting electrode for the base electrode of the transistor and the externally connecting electrode region 163A serving as the externally connecting electrode for the emitter electrode is effected (regions indicated by dot-dash lines). Based on necessity of maintaining insulating property between adjacent regions 161, 163A, 164A after separation, the dicing width in this step is set to about 0.1 mm, for example. In addition, as described above, the dicing depth is selected to enter into the resin layer 178 by a distance of about 2 to 5 μm to electrically isolate the active device forming region 161 from the externally connecting electrode regions 163A, 164A firmly.

At this time, since a film thickness of the resin layer 178 is set with regard to dicing error in the dicing apparatus, the wiring patterns 167 are never disconnected in the step of forming the slit holes 180. Since the plating layer 160A is formed on an non-principal surface of the semiconductor substrate 160 prior to this step, the plating layer 160A is formed only on the active device forming region 161 and the externally connecting electrode regions 163A, 164A, all serving as the external electrodes, by forming the slit holes 180. Therefore, no short-circuit occurs between respective electrodes by the plating layer 160A. In addition, no dedicated step of preventing such short-circuit is needed.

Next, as shown in FIG. 19, transistor cells X which are composed of the active device forming region 161 and the externally connecting electrode regions 163A, 164A formed on the semiconductor substrate 160 are separated into respective cells, thereby finishing the semiconductor device. As shown in FIG. 18, such separating step cuts off outer peripheral regions (shaded regions) of the transistor cells X on the substrates 160, 165 by the dicing blade of the dicing apparatus to separate into individual cells, thereby providing the semiconductor device.

According to the manufacturing method described above, the manufactured semiconductor device is secured to the conductive pad which is formed on the packaging substrate such as ceramics substrate, glass epoxy substrate, phenol substrate, metal substrate being subjected to the insulating process, and then packaged thereon. Since the solder cream is printed previously on the conductive pad, the semiconductor device can be secured to and packaged on the conductive pad on the packaging substrate if the semiconductor device fabricated according to the manufacturing method of the present invention is mounted by melting solder. This securing and packaging step, though not shown, can be effected by the same step as the packaging step for use in other circuit elements such as tip capacitor, tip resistor, etc. which are packaged on the packaging substrate.

Here the resin layer 178 acts to fix both substrates 160, 165 upon dicing. However, the resin layer 178 may be left as it is with taking account of corrosion resistance of IC, but such resin layer 178 may be removed finally since corrosion resistance of IC can be assured by the barrier metal and the metal bump is made of Au in the present invention.

Various modifications will become possible for those skilled in the art after receiving the teachings of the present disclosure without departing from the scope thereof.

What is claimed is:

1. A semiconductor device comprising:
    a first semiconductor substrate in which diffusion layers constituting an active device are formed, a first electrode of the active device being formed on a surface of the first semiconductor substrate and a second electrode of the active device being formed on a back surface of the first semiconductor substrate to be connected to an external circuit;
    second semiconductor substrates in which respective structures formed continuously from the first semiconductor substrate are isolated by slits, and for serving as electrodes themselves, third electrodes being formed on surfaces of the second semiconductor substrates and fourth electrodes being formed on back surfaces of the second semiconductor substrates to be connected to the external circuits; and
    a connecting means for connecting electrically the first electrode to the third electrodes,
    wherein the slits formed between the first semiconductor substrate and the second semiconductor substrates are fixed by an insulating adhesive resin.

2. A semiconductor device according to claim 1, wherein surfaces of the second electrode and the fourth electrodes are formed as a same plane.

3. A semiconductor device according to claim 1, wherein the connecting means are formed on an insulating layer which is formed over the first semiconductor substrate and the second semiconductor substrates.

4. A semiconductor device according to claim 1, wherein the connecting means made of a metal fine wiring.

5. A semiconductor device according to claim 1, wherein edge portions of the slits on the second semiconductor substrates are tapered.

6. A semiconductor device comprising:
    a first semiconductor substrate in which diffusion layers constituting an active device are formed, a first electrode of the active device being formed on a surface of the first semiconductor substrate and a second electrode of the active device being formed on a back surface of the first semiconductor substrate to be connected to an external circuit;

second semiconductor substrates in which structures formed continuously from the first semiconductor substrate are isolated by slits, and for serving as electrodes themselves, third electrodes being formed on surfaces of the second semiconductor substrates and fourth electrodes being formed on back surfaces of the second semiconductor substrates to be connected to the external circuits; and a wiring substrate on which means for connecting electrically the first electrode to the third electrodes is formed;

wherein the slits formed between the first semiconductor substrate and the second semiconductor substrates are fixed by an insulating adhesive resin.

7. A semiconductor device according to claim 6, wherein the wiring substrate is made of silicon substrate, glass epoxy substrate, ceramics substrate, or metal substrate being subjected to insulating process.

8. A semiconductor device according to claim 6, wherein surfaces of the second electrode and the fourth electrodes are formed as a same plane.

9. A semiconductor device according to claim 6, wherein edge portions of the slits on the second semiconductor substrates are tapered.

10. A semiconductor device according to claim 6, further comprising:

first metal bumps provided on the first electrode and the third electrodes;

second metal bumps secured to the connecting means so as to correspond to the first metal bumps; and conjunction layers for electrically connecting the first metal bumps to the second metal bumps.

11. A semiconductor device comprising:

a first semiconductor substrate in which diffusion layers constituting a transistor are formed, control electrode of the transistor and electrode on a current flowing-out side (or current flowing-in side) being formed on a surface of the first semiconductor substrate and electrodes of the transistor on a current flowing-in side (or current flowing-out side) being formed on a back surface of the first semiconductor substrate;

second semiconductor substrates in which structures formed continuously from the first semiconductor substrate are isolated by slits, and for serving as electrodes themselves, a first electrode being formed on a surface of the second semiconductor substrates and a second electrode being formed on a back surface of the second semiconductor substrates;

third semiconductor substrates in which structures formed continuously from the first semiconductor substrate are isolated by slits, and for serving as electrodes themselves, a third electrode being formed on a surface of the third semiconductor substrates and a fourth electrode being formed on a back surface of the third semiconductor substrates; and a wiring substrate on which means for connecting the control electrode to the first electrode and connecting the electrode on the current flowing-out side (or current flowing-in side) to the third electrode and arranged on the first semiconductor substrate, the second semiconductor substrates, and the third semiconductor substrates.

12. A semiconductor device according to claim 11, wherein the wiring substrate is arranged on the first semiconductor substrate, the second semiconductor substrates, and the third semiconductor substrates, and is made of silicon substrate, glass epoxy substrate, ceramics substrate, or metal substrate being subjected to insulating process.

13. A semiconductor device according to claim 11, wherein surfaces of the electrode on the current flowing-in side (or current flowing-out side), the second electrode, and the fourth electrodes are formed to form a same plane.

14. A semiconductor device according to claim 11, wherein the slits formed between the first semiconductor substrate and the second semiconductor substrates are fixed by insulating adhesive resin, and the slits formed between the first semiconductor substrate and the third semiconductor substrates are fixed by insulating adhesive resin.

15. A semiconductor device according to claim 11, wherein edge portions of the slits on the second semiconductor substrates are tapered.

16. A semiconductor device comprising:

a first semiconductor substrate in which diffusion layers constituting an active device are formed, a first electrode of the active device being formed on a surface of the first semiconductor substrate and a second electrode of the active device being formed on a back surface of the first semiconductor substrate to be connected to one of a plurality of conductive patterns of a packaging substrate;

second semiconductor substrates in which respective structures formed continuously from the first semiconductor substrate are isolated by slits, and for serving as electrodes themselves, third electrodes being formed on surfaces of the second semiconductor substrates and fourth electrodes being formed on back surfaces of the second semiconductor substrates to be connected to another one of the plurality of conductive patterns of the packaging substrate; and a connecting means for connecting electrically the first electrode to the third electrodes;

wherein the slits formed between the first semiconductor substrate and the second semiconductor substrates are fixed by an insulating adhesive resin.

17. A semiconductor device comprising:

a first semiconductor substrate in which diffusion layers constituting an active device are formed, a first electrode of the active device being formed on a surface of the first semiconductor substrate and a second electrode of the active device being formed on a back surface of the first semiconductor substrate to be connected to one of a plurality of conductive patterns of a packaging substrate;

second semiconductor substrates in which structures formed continuously from the first semiconductor substrate are isolated by slits, and for serving as electrodes themselves, third electrodes being formed on surfaces of the second semiconductor substrates and fourth electrodes being formed on back surfaces of the second semiconductor substrates to be connected to another one of the plurality of conductive patterns of the packaging substrate; and a wiring substrate on which means for connecting electrically the first electrode to the third electrodes is formed;

wherein the slits formed between the first semiconductor substrate and the second semiconductor substrates are fixed by an insulating adhesive resin.

* * * * *